United States Patent [19]
McClure

[11] Patent Number: 5,841,709
[45] Date of Patent: Nov. 24, 1998

[54] MEMORY HAVING AND METHOD FOR TESTING REDUNDANT MEMORY CELLS

[75] Inventor: David C. McClure, Carrollton, Tex.

[73] Assignee: STMicroelectronics, Inc., Carrollton, Tex.

[21] Appl. No.: 758,586

[22] Filed: Nov. 27, 1996

Related U.S. Application Data

[63] Continuation-in-part of Ser. No. 582,424, Dec. 29, 1995, Pat. No. 5,612,918.

[51] Int. Cl.[6] .................................................. G11C 29/00
[52] U.S. Cl. ...................... 365/200; 365/201; 365/225.7; 365/230.06
[58] Field of Search ..................................... 365/200, 201, 365/225.7, 230.06, 189.04

[56] References Cited

U.S. PATENT DOCUMENTS

| | | | |
|---|---|---|---|
| 4,228,528 | 10/1980 | Cenker et al. | 365/200 |
| 4,573,146 | 2/1986 | Graham et al. | 365/200 |
| 4,601,019 | 7/1986 | Shah et al. | 365/200 |
| 4,656,610 | 4/1987 | Yoshida et al. | 365/200 |
| 4,689,494 | 8/1987 | Chen et al. | 365/200 |
| 4,714,839 | 12/1987 | Chung | 307/441 |
| 4,734,889 | 3/1988 | Mashiko et al. | 365/200 |
| 4,791,615 | 12/1988 | Pelley, III et al. | 365/200 |
| 4,829,480 | 5/1989 | Seo | 365/200 |
| 4,833,652 | 5/1989 | Isobe et al. | 365/201 |
| 4,837,747 | 6/1989 | Dosaka et al. | 371/10 |
| 4,860,260 | 8/1989 | Saito et al. | 365/200 |
| 4,985,866 | 1/1991 | Nakaizuri | 365/200 |
| 5,034,925 | 7/1991 | Kato | 365/200 |
| 5,058,059 | 10/1991 | Matsuo et al. | 365/96 |
| 5,091,884 | 2/1992 | Kagami | 365/200 |
| 5,107,464 | 4/1992 | Sahara et al. | 365/200 |
| 5,113,371 | 5/1992 | Hamada | 365/201 |
| 5,124,948 | 6/1992 | Takazawa et al. | 365/200 |
| 5,146,429 | 9/1992 | Kawai et al. | 365/200 |
| 5,177,743 | 1/1993 | Shinoda et al. | 365/200 |

(List continued on next page.)

FOREIGN PATENT DOCUMENTS

| | | |
|---|---|---|
| 0 290 094 | 11/1988 | European Pat. Off. |
| 0 361 404 | 4/1990 | European Pat. Off. |
| 0 376 245 | 7/1990 | European Pat. Off. |
| 39 06 897 A1 | 9/1989 | Germany. |
| 2 165 971 | 4/1986 | United Kingdom. |
| 2 231 984 | 11/1990 | United Kingdom. |

OTHER PUBLICATIONS

Nishimura et al., "A Redundancy Test–Time Reduction Technique in 1–Mbit DRAM with a Multibit Test Mode," *IEEE Journal of Solid–State Circuits* 24(1):43–49, 1989.

Kayano et al., "25–ns 256K ×1/64K ×4 CMOS SRAM's," *IEEE Journal of Solid–State Circuits* SC–21(5):686–690, 1986.

Childs et al., "An 18 ns 4K ×4 CMOS SRAM," *IEEE J. Solid State Circuits* SC–19(5):545–51, 1984.

Sakurai et al., "A Low Power 46 ns 256 kbit CMOS Static Ram with Dynamic Double Word Line," *IEEE J. Solid–State Circuits* SC–19(5):578–585, 1984.

Hardee et al., "A Fault–tolerant 20 ns/375 mW 16K ×1 NMOS Static Ram," *IEEE J. Solid–State Circuits* Sc–16(5):435–443, 1981.

*Primary Examiner*—Tan T. Nguyen
*Attorney, Agent, or Firm*—David V. Carlson; Theodore E. Galanthay; Lisa K. Jorgenson

[57] ABSTRACT

A memory device includes an array of matrix memory cells that each correspond to a matrix location within the matrix array, an array of redundant memory cells that each correspond to a redundant location within the redundant array, and address and test circuitry. During a first test mode that is performed before any redundant cells have been mapped to the addresses of matrix locations, the address and test circuitry simultaneously addresses all of the matrix locations and selects all of the redundant memory cells. During a second test mode that is performed after the first test mode, the address and test circuitry simultaneously addresses all of the matrix locations and selects only those redundant memory cells that are mapped to the addresses of matrix locations. Typically, the redundant memory cells are so mapped to replace defective matrix memory cells.

22 Claims, 10 Drawing Sheets

U.S. PATENT DOCUMENTS

| | | | |
|---|---|---|---|
| 5,195,057 | 3/1993 | Kasa et al. | 365/200 |
| 5,257,229 | 10/1993 | McClure et al. | 365/200 |
| 5,262,994 | 11/1993 | McClure | 365/200 |
| 5,281,868 | 1/1994 | Morgan | 307/441 |
| 5,295,102 | 3/1994 | McClure | 365/200 |
| 5,299,161 | 3/1994 | Choi et al. | 365/201 |
| 5,299,164 | 3/1994 | Takeuchi et al. | 365/201 |
| 5,307,316 | 4/1994 | Takemae | 365/200 |
| 5,311,472 | 5/1994 | Ota | 365/200 |
| 5,327,382 | 7/1994 | Seno et al. | 365/201 |
| 5,337,278 | 8/1994 | Cho | 365/200 |
| 5,355,340 | 10/1994 | Coker et al. | 365/200 |
| 5,377,146 | 12/1994 | Reddy et al. | 365/200 |
| 5,381,370 | 1/1995 | Lacey et al. | 365/200 |
| 5,404,331 | 4/1995 | McClure | 365/201 |
| 5,455,798 | 10/1995 | McClure | 365/200 |
| 5,471,426 | 11/1995 | McClure | 365/200 |
| 5,530,674 | 6/1996 | McClure et al. | 365/201 |
| 5,544,106 | 8/1996 | Koike | 365/200 |
| 5,572,470 | 11/1996 | McClure et al. | 365/200 |
| 5,574,688 | 11/1996 | McClure et al. | 365/200 |
| 5,608,678 | 3/1997 | Lysinger | 365/200 |
| 5,631,868 | 5/1997 | Termullo, Jr. et al. | 365/200 |

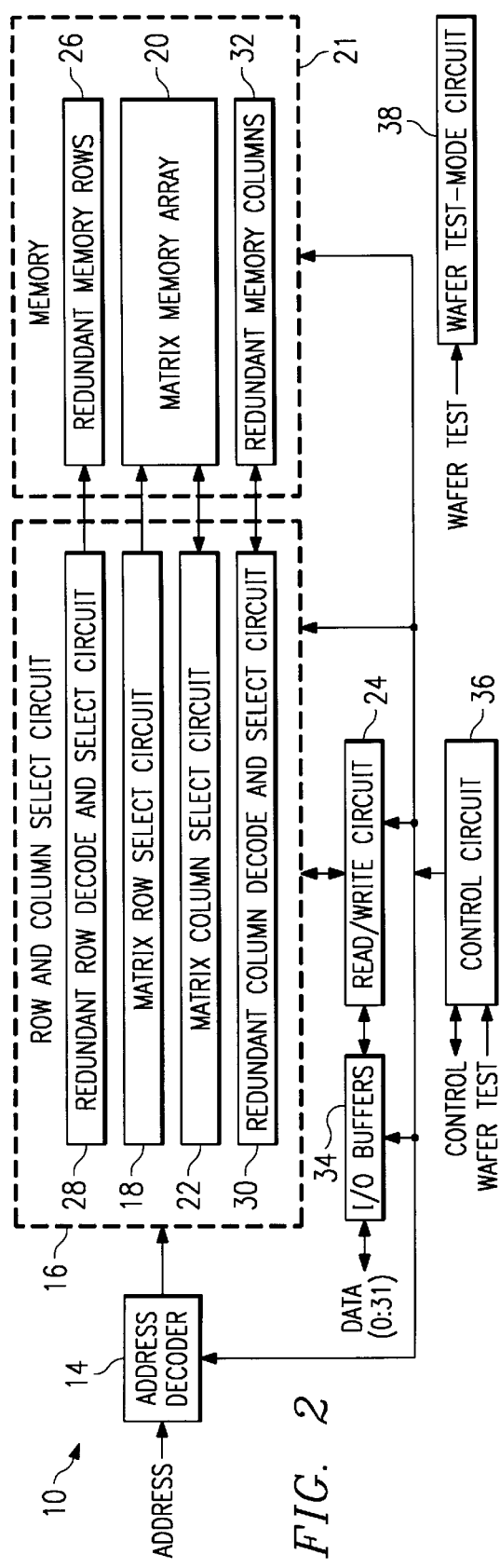
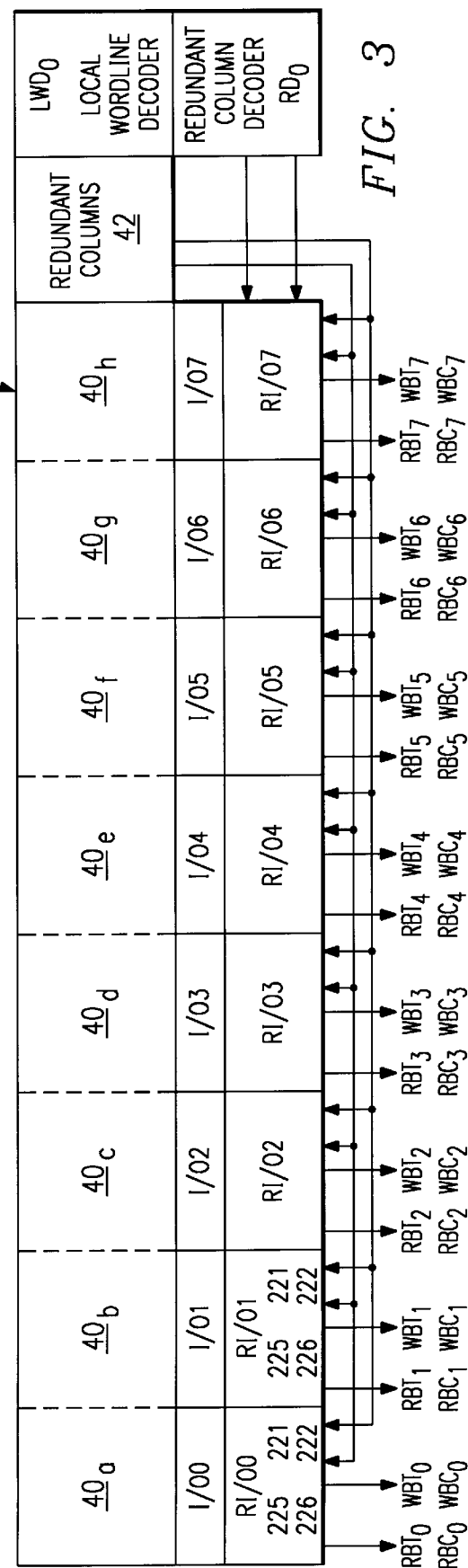
FIG. 2
FIG. 3

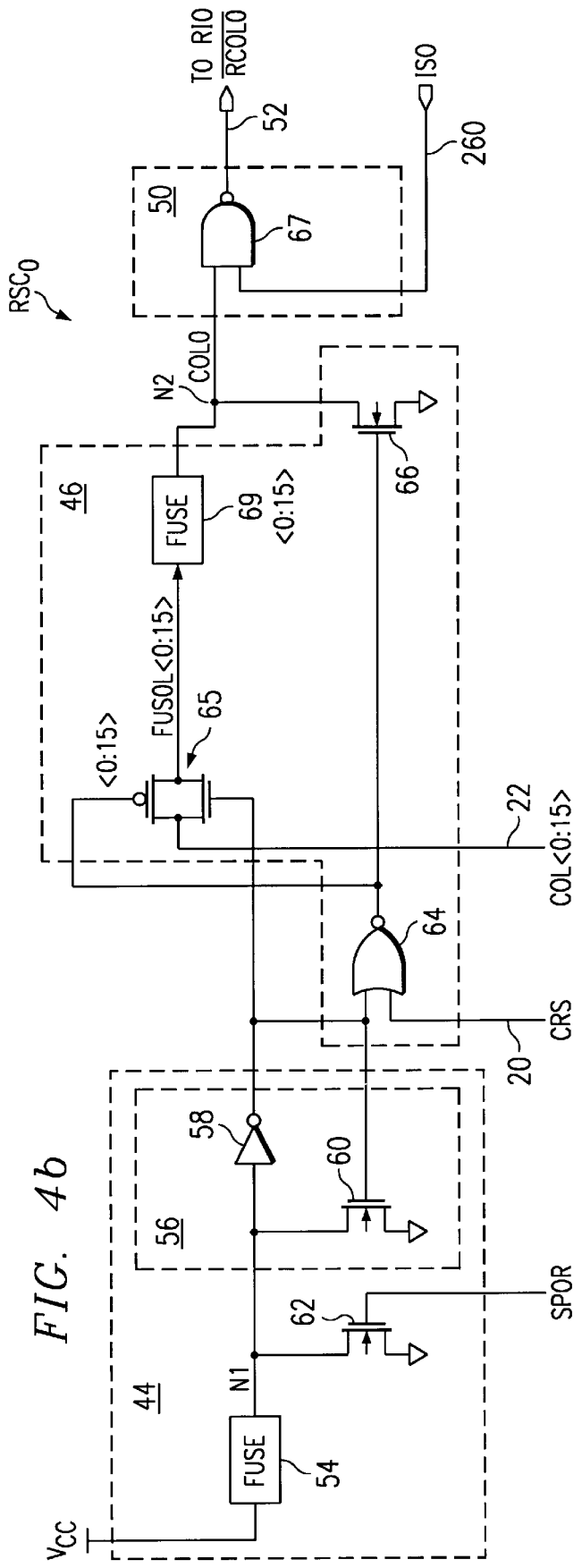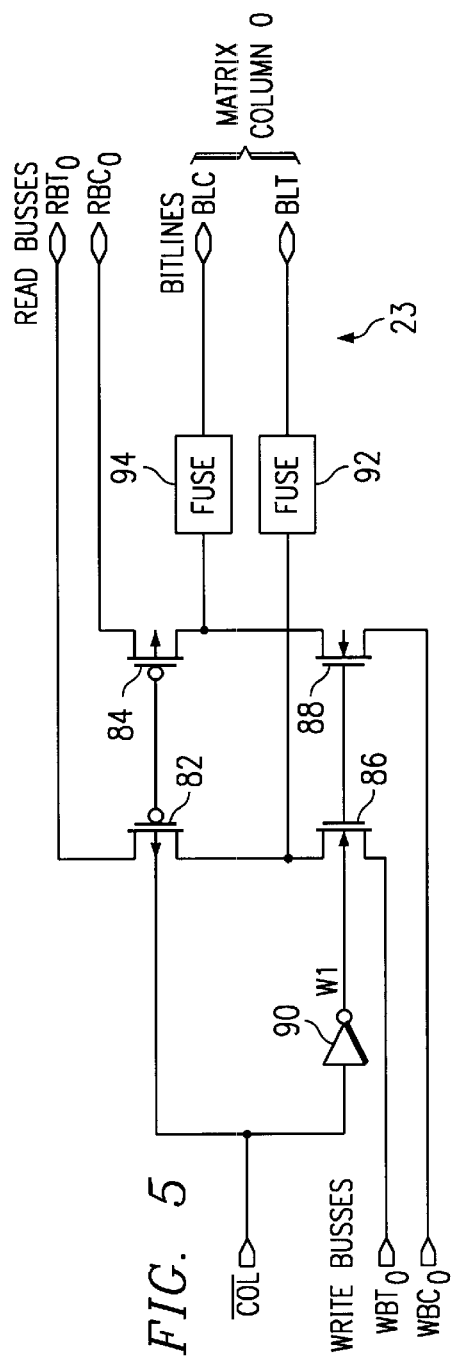
FIG. 4b
FIG. 5

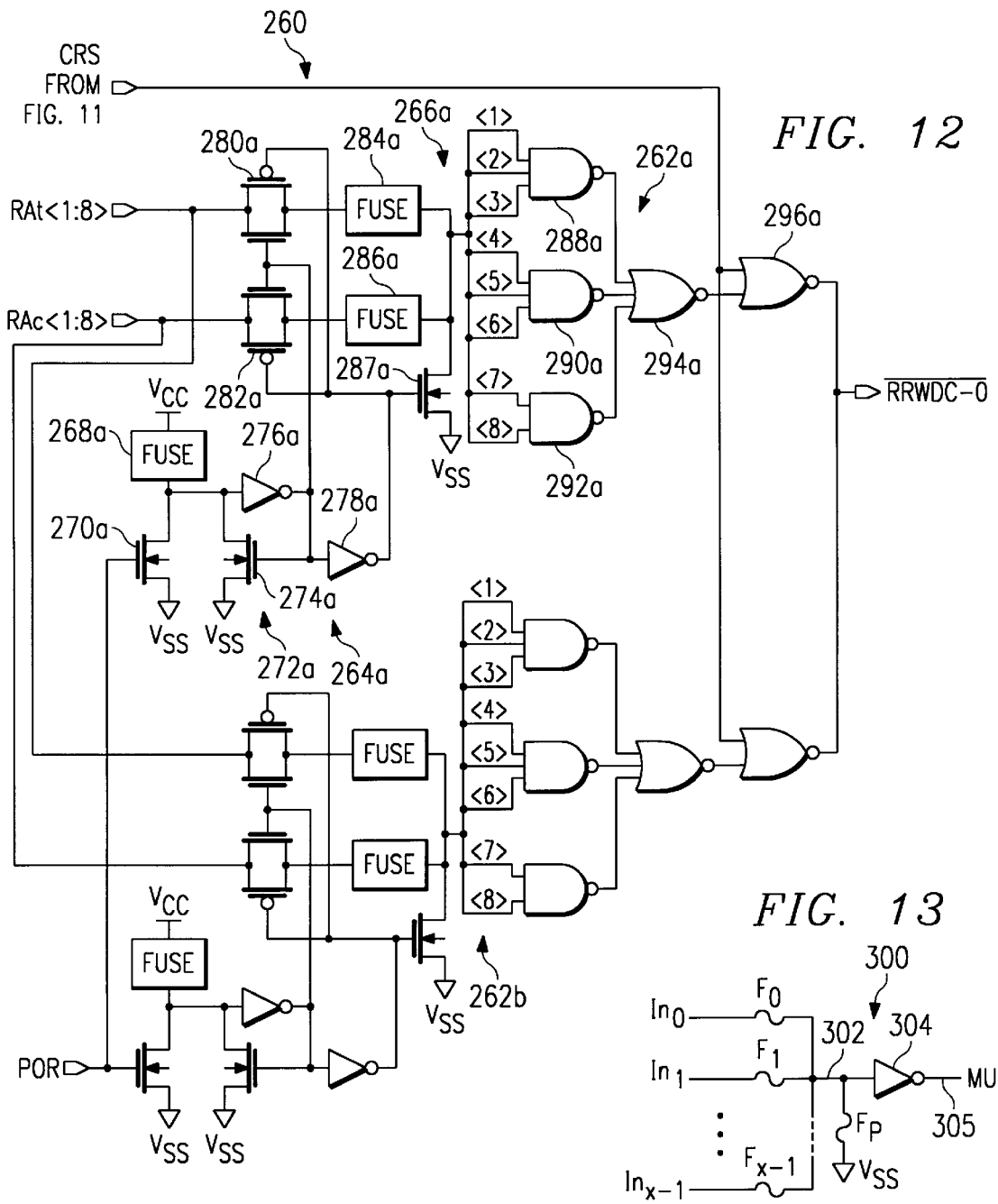
FIG. 12
FIG. 13
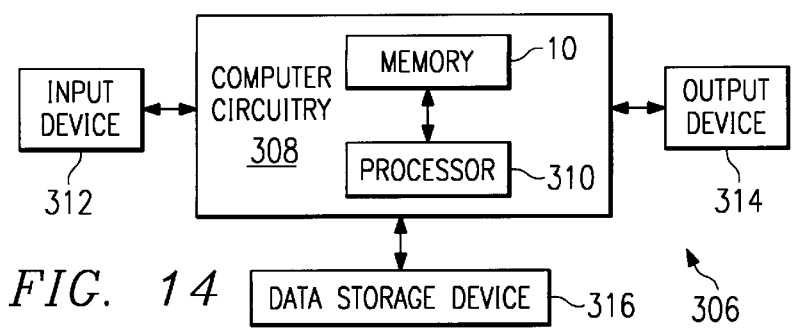
FIG. 14

MEMORY HAVING AND METHOD FOR TESTING REDUNDANT MEMORY CELLS

CROSS-REFERENCE TO PRIOR APPLICATION

This application is a continuation-in-part of U.S. patent application Ser. No. 08/582,424, entitled REDUNDANCY ARCHITECTURE, filed Dec. 29, 1995, now U.S. Pat. No. 5,612,918, issued Mar. 18, 1997.

This application is related to U.S. patent application Ser. No. 08/710,357, entitled INTEGRATED CIRCUIT THAT SUPPORTS AND METHOD FOR WAFER-LEVEL TESTING, filed Sep. 17, 1996, now pending U.S. patent application Ser. No. 08/710,356, entitled INTEGRATED-CIRCUIT DIE SUITABLE FOR WAFER-LEVEL TESTING AND METHOD FOR FORMING THE SAME, filed Sep. 17, 1996, now pending U.S. patent application Ser. No. 08/758,582, entitled CIRCUIT AND METHOD FOR REPLACING A DEFECTIVE MEMORY CELL WITH A REDUNDANT MEMORY CELL, filed Nov. 27, 1996, now pending and U.S. patent application Ser. No. 08/758,587 entitled CIRCUIT AND METHOD FOR SELECTING A SIGNAL, filed Nov. 27, 1996, now pending.

TECHNICAL FIELD

The present invention relates generally to integrated circuits, and more specifically to a memory device that supports a first test mode for testing all redundant memory cells and a second test mode for testing only those redundant memory cells that have been mapped to addresses of matrix memory cells, and a method for such testing.

BACKGROUND OF THE INVENTION

Many of today's integrated memory circuits include redundant memory cells that are available to replace malfunctioning or defective matrix memory cells. Typically, the entire matrix row or column to which a defective memory cell belongs is identified as defective and is respectively replaced with a redundant row or column. Often, one defective matrix row or column alone can cause a memory circuit to malfunction. Therefore, by including redundant rows and columns on integrated memory circuits, engineers can repair otherwise unusable memory circuits and increase the overall manufacturing yield of operational memory circuits.

Typically, engineers test a memory circuit shortly after it is manufactured to find and identify rows and columns that contain defective memory cells. For example, after a test station identifies a defective column, it maps a redundant column to the address of the defective column. During normal operation of the memory circuit when an external circuit, such as a processor, writes data to the address of a memory cell in the defective column via a data bus, a redundancy circuit within the memory circuit isolates the defective column from the data bus and diverts the data to a corresponding memory cell in the redundant column. The redundancy circuit within the memory circuit performs this isolation and diversion in a manner that is transparent to the external circuit.

One problem with many known memory devices is that the redundant memory cells cannot be adequately stressed or tested before the mapping procedure to identify defective redundant rows and columns. Therefore, it is possible that a defective redundant row or column may be mapped to replace a defective matrix row or column, respectively. Although such a defective mapped redundant row or column can be unmapped and replaced with another redundant row or column respectively, such a procedure is often time consuming and costly.

Further background on memories, redundant memory cells, and redundancy circuits can be found in: Prince, Betty, *Semiconductor Memories, A Handbook of Design, Manufacture, and Applications,* 2nd Edition, John Wiley and Sons, (1991); Hardee et al., "A Fault-Tolerant 30 ns/375 mW 16K X 1 NMOS Static RAM," *Journal of Solid State Circuits* SC-16(5):435–43 (IEEE, 1981); Childs et al., "An 18 ns 4K X 4 CMOS SRAM," *Journal of Solid State Circuits* SC-19(5):545–51 (IEEE, 1984); and *ISSCC Proceedings From* 1975 *to the present,* all of which are incorporated herein by reference.

SUMMARY OF THE INVENTION

In accordance with one aspect of the present invention, a memory device includes an array of matrix memory cells that each correspond to a matrix location within the matrix array, an array of redundant memory cells that each correspond to a redundant location within the redundant array; and address and test circuitry that is coupled to both the matrix and redundant arrays. During a first test mode, the address and test circuitry simultaneously addresses all of the matrix locations and selects all of the redundant memory cells. During a second test mode, the address and test circuitry simultaneously addresses all of the matrix locations and selects only those redundant memory cells that are mapped to the addresses of matrix locations.

An advantage provided by one aspect of the invention is the ability to test all redundant rows and columns before any of them have been mapped to replace defective matrix rows and columns, respectively, and then, after such mapping has occurred, to test only mapped redundant rows and columns.

BRIEF DESCRIPTION OF THE DRAWINGS

FIG. 2 is a schematic block diagram of one embodiment of the memory circuit of FIG. 1.

FIG. 3 is a diagram of a memory block of the memory circuit of FIG. 1.

FIG. 4b is a schematic diagram of a redundant-address-signal generator of FIG. 4a.

FIG. 5 is a schematic diagram of a first embodiment of a memory-column select circuit of the matrix-column select circuit of FIG. 2.

FIG. 12 is a schematic diagram of one embodiment of the redundant-row decode and select circuit of FIG. 2.

FIG. 13 is a schematic diagram of a multiplexer circuit according to the present invention.

FIG. 14 is a schematic block diagram of a computer system that incorporates the memory circuit of FIGS. 1 and 2.

DETAILED DESCRIPTION OF THE INVENTION

Figure 1A:
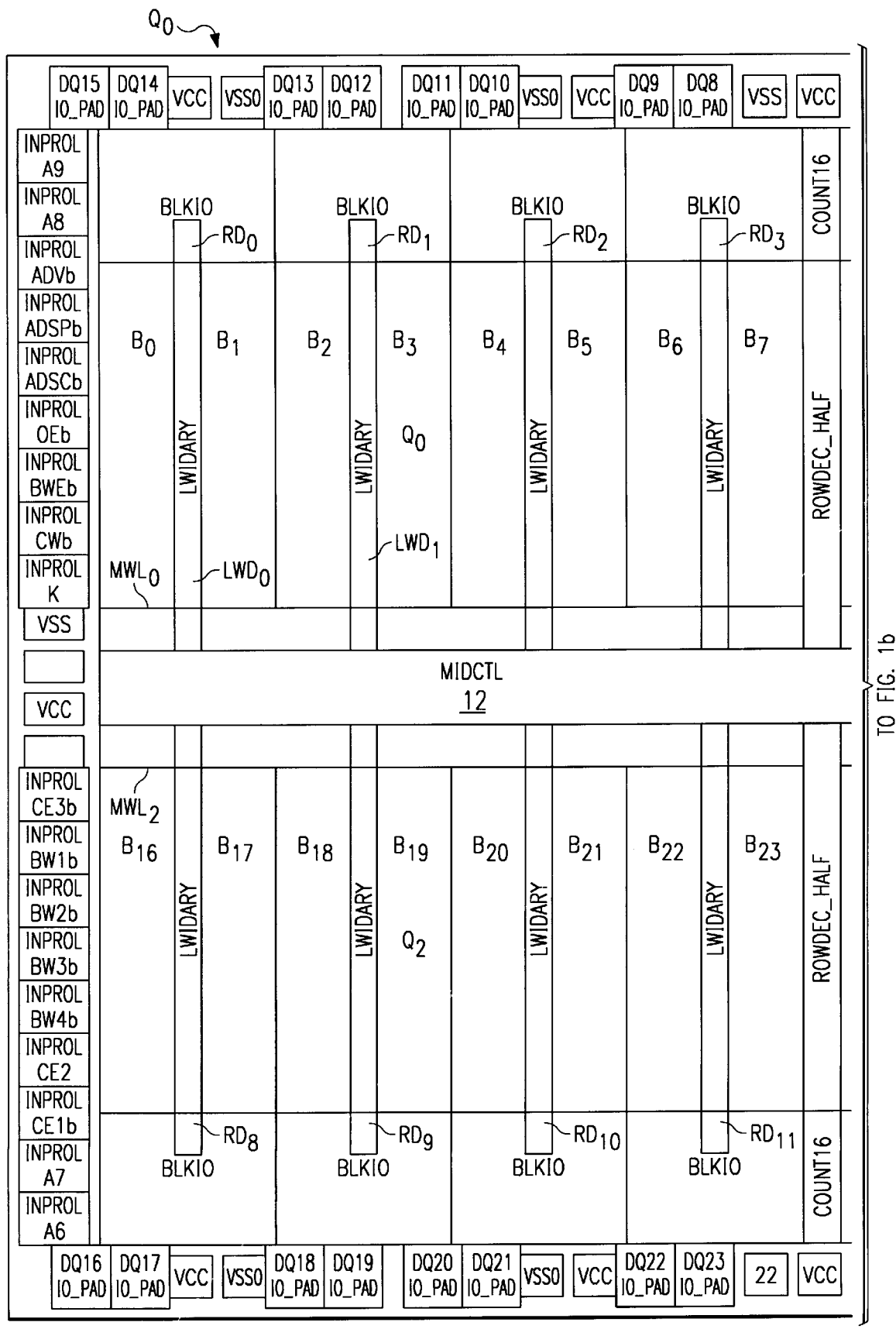
FIG. 1 is a diagram of an integrated memory circuit according to the present invention.
Figure 1B:
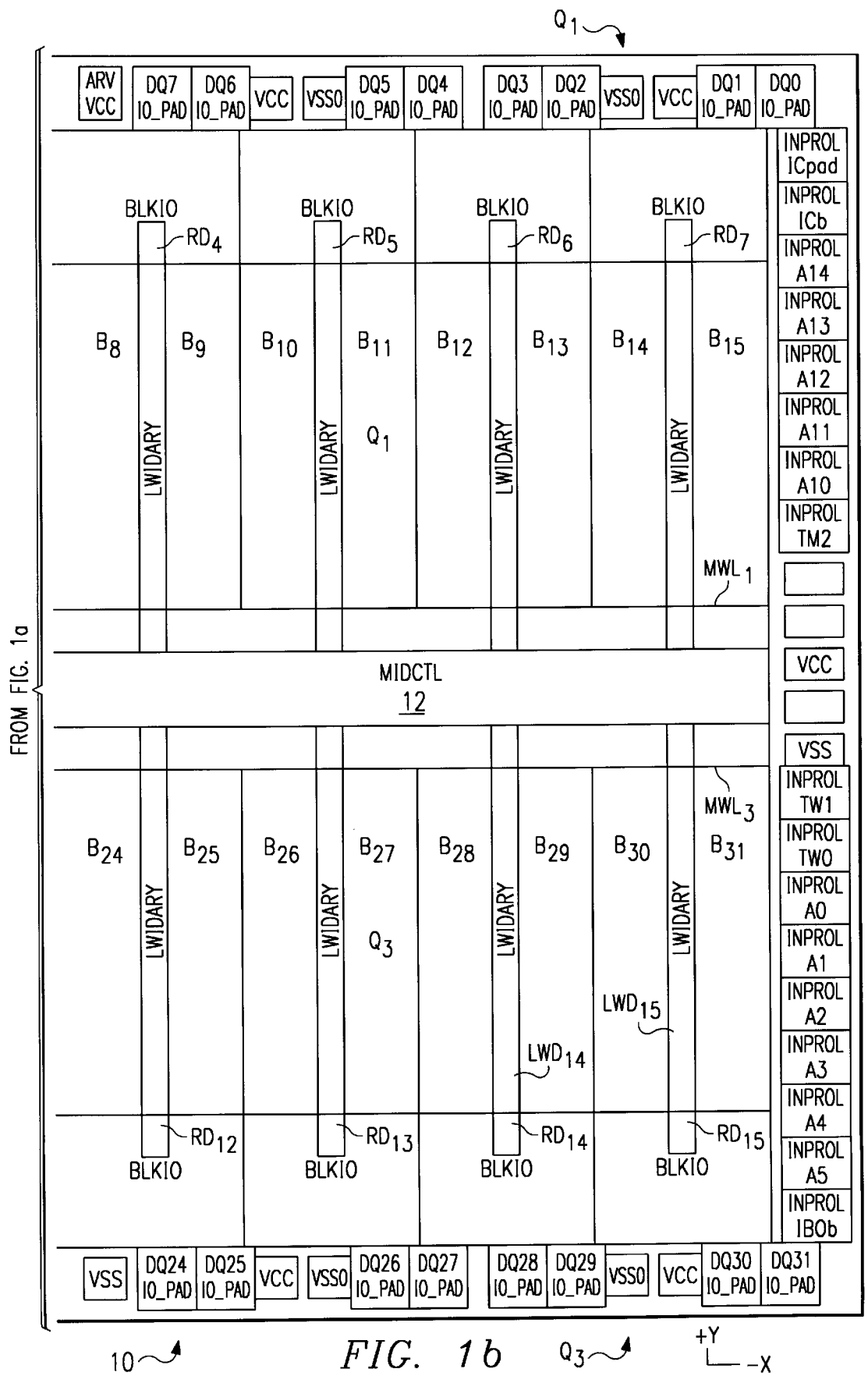

FIG. 1 is a block diagram of a memory device or circuit 10 according to the present invention. In one aspect of the invention, the memory device 10 is a 32K X 32-bit Burst Static Random Access Memory (Burst SRAM).

The memory 10 has its matrix memory cells arranged in an even number of memory blocks $B_0$–$B_{31}$, although other embodiments of the memory 10 may have more, fewer, or an odd number of such memory blocks. The memory cells in each block $B_0$–$B_{31}$, are arranged in rows and columns. A row refers to a group of memory cells that is coupled to a common word line, and a column refers to a group of memory cells that is coupled to a common bit line, or in the case of an SRAM, to a common pair of complementary bit lines.

The blocks $B_0$–$B_{31}$ are divided into four quadrants $Q_0$–$Q_3$ of 8 blocks each. That is, quadrant $Q_0$ includes blocks $B_0$–$B_7$, quadrant $Q_1$ includes blocks $B_8$–$B_{15}$, quadrant $Q_2$ includes blocks $B_{16}$–$B_{23}$, and quadrant $Q_4$ includes blocks $B_{24}$–$B_{31}$. Each quadrant $Q_0$–$Q_3$ provides 8 of the 32 data bits $D_0$–$D_{31}$ that the memory 10 provides. During a read or write cycle, one block from each quadrant is accessed and provides the 8 bits of data for that quadrant. For example, during a read or write cycle, blocks $B_0$ from quadrant $Q_0$, $B_8$ from quadrant $Q_1$, $B_{16}$ from quadrant $Q_2$, and $B_{24}$ of quadrant $Q_3$, are simultaneously activated together to provide $D_0$–$D_{31}$. A master word-line decoder 12 is located along one center axis of the memory device 10. Master word lines $MWL_0$–$MWL_3$ run through each quadrant $Q_0$–$Q_3$, respectively. Local-word-line decoders $LWD_0$–$LWD_{15}$ are respectively located between each pair of blocks $B_0$–$B_{31}$.

The memory 10 also includes 16 Block Input/Output circuits ($BLKIO_{0\text{-}15}$) that are each associated with a corresponding pair of blocks $B_0$–$B_{31}$. The BLKIO circuits couple the memory cells within the blocks $B_0$–$B_{31}$ to corresponding ones of the 32 external data input/output pins or terminals $DQ_0$–$DQ_{31}$. The memory 10 also includes other external terminals for receiving address signals, control signals, and power signals from external circuitry (not shown). A memory device that is similar to the memory 10 is discussed in U.S. patent application Ser. No. 08/587,708, entitled DEVICE AND METHOD FOR DRIVING A CONDUCTIVE PATH WITH A SIGNAL, filed Jan. 19, 1996; U.S. patent application Ser. No. 08/588,762, entitled DATA-INPUT DEVICE FOR GENERATING TEST SIGNALS ON BIT AND BIT-COMPLEMENT LINES, filed Jan. 19, 1996; U.S. patent application Ser. No. 08/589,141, entitled WRITE DRIVER HAVING A TEST FUNCTION, filed Jan. 19, 1996; U.S. patent application Ser. No. 08/589,140, entitled MEMORY-ROW SELECTOR HAVING A TEST FUNCTION, filed Jan. 19, 1996; U.S. patent application Ser. No. 08/588,740, entitled DEVICE AND METHOD FOR ISOLATING BIT LINES FROM A DATA LINE, filed Jan. 19, 1996; and U.S. patent application Ser. No. 08/589,024, entitled LOW-POWER READ CIRCUIT AND METHOD FOR CONTROLLING A SENSE AMPLIFIER, filed Jan. 19, 1996, which are incorporated by reference herein.

FIG. 2 is a schematic block diagram of the memory 10 of FIG. 1. An address decoder 14 receives an address signal from external circuitry (not shown), decodes the address signal, and provides corresponding column-select and row-select signals to a row-and-column select circuit 16. A matrix-row select circuit 18 receives the row-select signals from the address decoder 14, and activates the word lines of the addressed matrix-memory rows in the matrix-memory array 20, which composes a portion of the memory array 21. Likewise, the matrix-column select circuit 22 receives the column-select signals from the address decoder 14, and couples the bit lines of the addressed matrix-memory columns in the matrix array 20 to the read/write circuit 24.

If, during initial testing of the memory 10, a defective matrix row of memory cells in the array 20 is found, it is replaced with one of the redundant memory rows 26 of redundant memory cells. That is, the redundant row is mapped to the address of the defective matrix row. When the defective matrix row is addressed, the redundant-row decode and select circuit 28 decodes the row-select signal from the address decoder 14 and activates the redundant word line associated with the mapped redundant row. Likewise, if during initial testing of the memory 10, a defective matrix column of memory cells in the array 20 is found, it is replaced with one of the redundant memory columns 32. That is, the redundant column is mapped to the address of the defective matrix column. When the defective matrix column is addressed, redundant-column decode and select circuit 30 decodes the column-select signal from the address decoder 14 and couples the read/write circuitry 24 to the complementary bit lines of the mapped redundant column. As discussed below in conjunction with FIGS. 5–7, the defective rows and columns of memory cells in the matrix array 20 are isolated from the read/write circuitry 24. Thus, the circuits 28 and 30 respectively allow mapping of the redundant rows 26 and the redundant columns 32 to the addresses of defective matrix rows and columns in the matrix array 20 in a manner that is transparent to the external circuitry that provides the address signal to the address decoder 14.

Still referring to FIG. 2, during a write cycle, the read/write circuit 24 couples data from the data bus to an addressed memory cell in the memory array 21 via input/output (I/O) buffers 34. During a read cycle, the read/write circuit 24 couples data from an addressed memory cell to the data bus via the I/O buffers 34. The read/write circuit 24 includes one or more write drivers for writing data to an addressed memory cell, and includes one or more sense amplifiers for reading data from an addressed memory cell. The I/O buffers 34 include input buffers for providing data from the data bus to the read/write circuit 24 during a write cycle, and include output buffers for providing data from the read/write circuit 24 to the data bus during a read cycle.

A control circuit 36 receives control signals from a control bus, and in response thereto, controls the operation of the address decoder 14, the row-and-column select circuit 16, the memory array 21, the read/write circuit 24, and the I/O buffers 34.

A wafer test-mode circuit 38 receives wafer test signals from a wafer test bus, and allows the memory 10 to operate in one or more test modes while the die (not shown) that includes the memory 10 is part of the wafer (not shown) on which it was formed, i.e., before the die is scribed from the wafer.

FIG. 3 is a block diagram of the memory block $B_0$ of the memory 10 of FIG. 1. Although the block $B_0$ is shown and discussed, it is understood that the remaining blocks $B_1$–$B_{31}$, are constructed and operate in a similar fashion. In the described embodiment of the invention, the block $B_0$ has 8 matrix-column groups 40a–40h, which each include 16 matrix memory columns. Thus, the block $B_0$ includes a total of 128 matrix memory columns.

Each matrix-column group 40a–40h has associated therewith a respective input/output (I/O) circuit $I/O_0$–$I/O_7$. The associated I/O circuit selects the addressed one of the 16 columns in a group 40, and during a read cycle, respectively couples the bit-true and bit-complement lines of the selected matrix column to the associated one of the read-true ($RBT_0$–$RBT_7$) lines and the associated one of the read-complement ($RBC_0$–$RBC_7$) lines. Likewise, during a write cycle, the I/O circuit respectively couples the bit-true and bit-complement lines of the selected matrix column to the associated one of the write-true ($WBT_0$–$WBT_7$) lines and the associated one of the write-complement ($WBC_0$–$WBC_7$) lines.

The block $B_0$ also includes a redundant-column group 42, which includes one or more redundant memory columns that are available to replace defective columns in any of the matrix-column groups 40a–40h. The number of redundant columns in the redundant-column group 42 is based on a balancing between the anticipated number of matrix columns within the groups 40a–40h that will have defective memory cells and the amount and cost of the additional area required for each redundant column. In the described embodiment, the redundant-column group 42 includes two redundant columns. Because each block $B_0$–$B_{31}$ has its own redundant-column group 42, the redundant-column decode and select circuit 30 (FIG. 2) need not be centrally located, and can be distributed among each of the blocks $B_0$–$B_{31}$. Such local distribution often reduces the complexity of and the area required by the routing of interconnections within the circuit 30. Furthermore, the redundant columns of the block $B_0$ can use the same local-word-line driver $LWD_0$ as the matrix memory columns, thus reducing the programming overhead.

Redundant input/output select circuits $RI/O_0$–$RI/O_7$ are coupled between each of the redundant columns in the redundant-column group 42 and associated ones of the read-bit true lines $RBT_0$–$RBT_7$, the read-bit complement lines $RBC_0$–$RBC_7$, the write-bit true lines $WBT_0$–$WBT_7$, and the write-bit complement lines $WBC_0$–$WBC_7$. For example, the block $RI/O_0$ is coupled between each of the redundant columns and $RBT_0$, $RBC_0$, $WBT_0$, and $WBC_0$.

A redundant-column decode circuit $RD_0$ receives a matrix-column select signal from the address decoder 14 (FIG. 2), and, when the corresponding matrix column in one of the groups 40a–40h is defective, activates a selected one of the redundant columns in the group 42 to replace the defective matrix column.

In operation during a normal read or write cycle, the local word line decoder $LWD_0$ activates the addressed row of matrix memory cells in the block $B_0$. The blocks $I/O_0$–$I/O_7$ each select the addressed one of the columns in a corresponding group 40a–40h (for a total of 8 selected columns, one from each group 40a–40h), and couple the bit-true and bit-complement lines of the selected column to the corresponding lines RBT and RBC, or WPT and WBC, depending upon whether the cycle is a read or a write. Thus, for example, during a read cycle, the circuit $I/O_0$ couples the bit-true line of a selected column in the group 40a to $RBT_0$ and couples the bit-complement line of the same column to $RBC_0$. During a write cycle, the circuit $I/O_0$ respectively couples the bit-true and bit-complement lines of the selected column in the group 40a to $WBT_0$ and $WBC_0$. As discussed below in conjunction with FIG. 5, in one embodiment of the invention, during both a read cycle and a write cycle, the circuit $I/O_0$ couples the bit-true line of the selected column in the group 40a to both $RBT_0$ and $WBT_0$, and couples the bit-complement line to both $RBC_0$ and $WBC_0$.

If a matrix column in one of the matrix-column groups 40a–40h is found to be defective, one of the redundant columns in the redundant-column group 42 is mapped to replace the defective matrix column. For example, suppose that a defective column is found in the group 40a. When this defective column is addressed, the circuit $RD_0$ generates a redundant-column select signal. In response to the redundant-column select signal, the circuit $RI/O_0$ respectively couples the bit-true and bit-complement lines of the mapped redundant column to $RBT_0$ and $RBC_0$ during a read cycle, and respectively couples the bit-true and bit-complement lines of the mapped redundant column to $WBT_0$ and $WBC_0$ during a write cycle. The circuit $I/O_0$ isolates the defective matrix column in the group 40a from $RBT_0$, $RBC_0$, $WBT_0$, and $WBC_0$ such that all data transactions are routed to the mapped redundant column instead of the defective memory column.

Figure 4A:
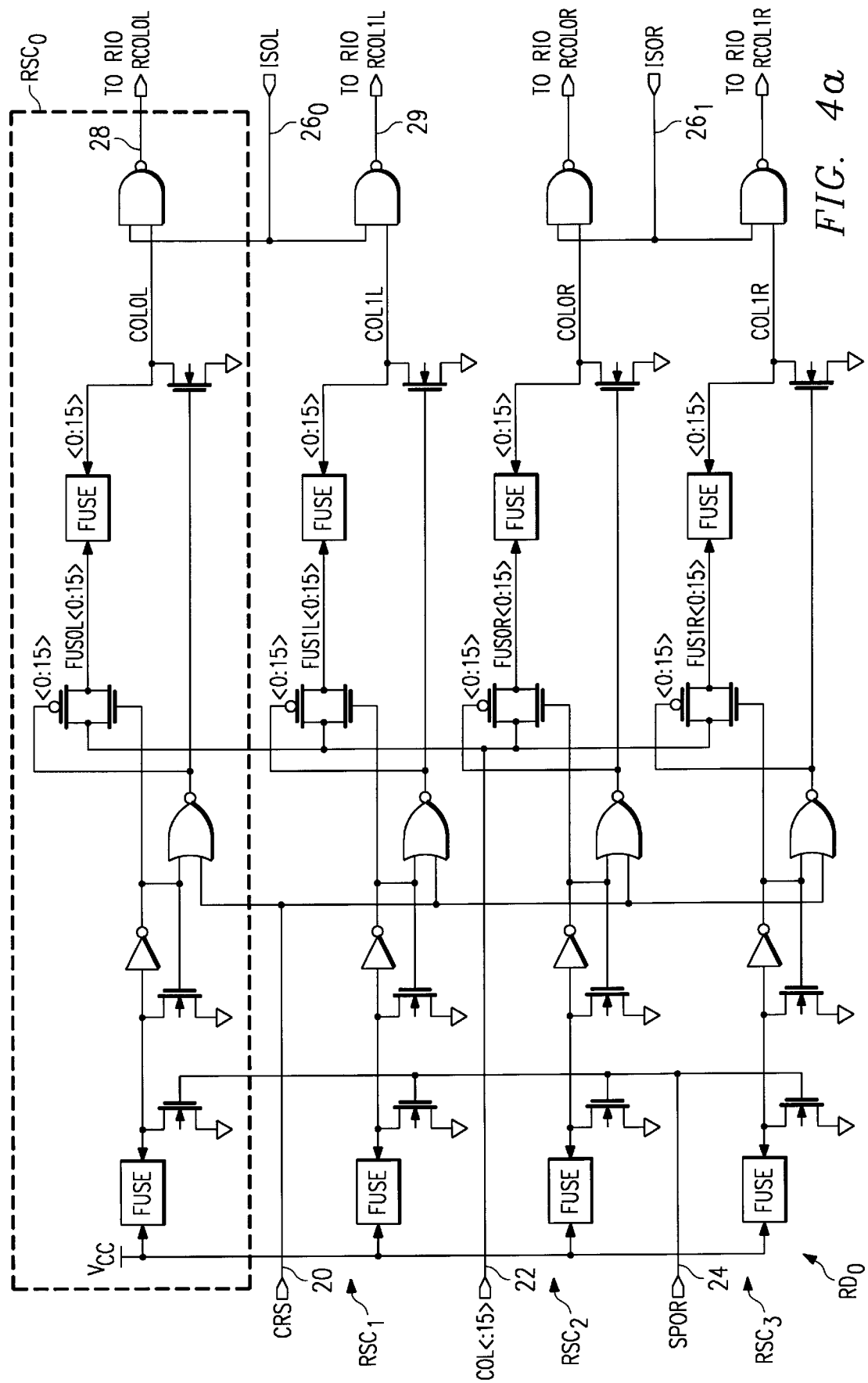
FIG. 4a is a schematic diagram of one embodiment of a redundant-column decoder of the redundant column select circuitry of FIG. 2.

FIG. 4a is a schematic diagram of one embodiment of the redundant decoder $RD_0$ of FIG. 3. In the described embodiment of the memory 10, there are 16 placements of redundant decoders $RD_0$–$RD_{15}$, one for every pair of blocks $B_0$–$B_{31}$. The decoder $RD_0$ is associated with blocks $B_0$ and $B_1$, and the remaining decoders $RD_1$–$RD_{15}$ are similar in structure and operation to the decoder $RD_0$. Furthermore, because each pair of blocks has a total of 4 redundant columns, each redundant decoder includes 4 redundant-address-signal generators $RSC_0$–$RSC_3$, one for each redundant column. Thus, with respect to $RD_0$, the address-signal generators $RSC_0$ and $RSC_1$ are available to generate redundant-address signals for the 2 redundant columns in the block $B_0$, and the generators $RSC_2$ and $RSC_3$ are available to generate redundant-address signals for the 2 redundant columns in the block $B_1$.

FIG. 4b is a schematic diagram of the signal generator $RSC_0$ of FIG. 4a. The generator $RSC_0$ includes an enable circuit 44, which enables the generator $RSC_0$ when the associated redundant column, redundant column 0, has been mapped to the address of a defective matrix column, and disables the generator $RSC_0$ when the redundant column 0 has not been so mapped. A control circuit 46 receives the matrix-column select signals COL<0:15> from the address decoder 14 (FIG. 2), and generates an active logic 1 at a node N2 when the matrix-column select signal COL<0:15> that corresponds to the defective column to which the redundant column 0 has been mapped has an active logic 1 signal level. There are a total of 16 placements of the circuit 46 within the generator $RSC_0$, one for each matrix-column select signal COL<0:15>. An output circuit 50 receives the signal at node N2 and generates on the output line 52 the active-low, redundant-column-select signal $\overline{RCOL0}$.

During a read or a write cycle, when the redundant column 0 has not been mapped to replace a defective matrix column, a selectively conductive element 54 of the enable circuit 44 is made conductive. The element 54 and similar elements discussed below may be a laser fuse, an electrical fuse, a programmable memory cell, or other element that has selectable conductivity. The conductive element 54 couples the supply voltage Vcc, which is equivalent to logic 1, to the input of a latch circuit 56, which includes an inverter 58 and an NMOS transistor 60. The latch 56 generates logic 0 at the output of the enable circuit 44. A NOR gate 64 of the control circuit 46 receives the logic 0 from the latch 56 at one input and a signal CRS, which is an inactive logic 0, at its other input terminal, and thus generates logic 1 at its output terminal. The logic 0 from the latch 56 and the logic 1 from the NOR gate 64 deactivate pass gates 65, which are each formed from an NMOS transistor that is coupled in parallel to a PMOS transistor. The inactive pass gates 65 thus prevent all of the signals COL<0:15> from propagating to the node N2. Furthermore, the logic 1 generated by the NOR gate 64 activates an NMOS transistor 66, which drives the node N2 to logic 0. The output circuit receives at one input terminal the logic 0 at the node N2 and receives a signal ISO, which is an active logic 1 to select the block $B_0$ at the other input terminal. Thus, the output circuit 50 generates an inactive logic 1 for the redundant-column select signal $\overline{RCOL0}$ on the line 52.

During a read or a write cycle, when the redundant column 0 has been mapped to replace a defective matrix column, the element 54 is made nonconductive. During power-up of the memory 10, a power on reset (POR) signal is logic 1 for a predetermined period of time, and during this period, activates a transistor 62 of the enable circuit 44. The active transistor 62 couples the input of the latch circuit 56 to ground, which is equivalent to logic 0. The latch circuit 56 maintains a logic 1 at its output even after POR returns to logic 0. The NOR gate 64 receives the logic 1 from the latch 56 and the signal CRS, which is an inactive logic 0, at its other input, and thus generates logic 0 at its output. The logic 1 from the latch 56 and the logic 0 from the NOR gate 64 activate the pass gates 65. All selectively conductive elements 69 are made nonconductive except the element 69 that corresponds to the defective column. Thus, when the one of the signals COL<0:15> that corresponds to the defective matrix column goes active logic 1, the logic 1 propagates through the corresponding pass gate 65 and conductive element 69 to the node N2. Because the logic 0 from the NOR gate 64 deactivates the transistor 66, the output circuit converts the logic 1 at the node N2 and the logic 1 ISO signal to an active logic 0 for $\overline{RCOL0}$. The active logic 0 for $\overline{RCOL0}$ selects the redundant column 0.

During a first test mode where all of the matrix-memory columns are tested simultaneously, and all of the redundant-memory columns are tested simultaneously whether or not they are mapped to replace defective memory columns, the signal CRS is active logic 1. In other words, during the first test mode, a test voltage is simultaneously applied via the bit lines to all matrix memory cells and all redundant memory cells in the memory circuit. If the redundant column 0 is not mapped to replace a defective matrix column, the element 54 is conductive, the output of the latch 56 is logic 0, and the output of the NOR gate 64 is logic 0. Thus, the PMOS transistors of the pass gates 65 are active, the elements 69 are conductive, and the signals COL <0:15>, which are all active logic 1 to simultaneously select all matrix columns, are coupled to the node N2. Furthermore, ISO is active logic 1, and the output circuit 50 generates $\overline{RCOL0}$ equal to logic 0, which thus selects the redundant column 0. If the redundant column 0 is mapped to replace a defective matrix column, the element 54 is nonconductive, the output of the latch 56 is logic 1, and the output of the NOR gate 64 is logic 0. Thus, the PMOS transistors of the pass gates 65 are active, only the element 69 that corresponds to the defective column is conductive, and the corresponding one of the signals COL <0:15>, which are all active logic 1 to simultaneously select all matrix columns, is coupled to the node N2. Furthermore, the transistor 66 is inactive, ISO is active logic 1, and the output circuit 50 generates $\overline{RCOL0}$ equal to logic 0, which thus selects the redundant column 0.

During a second test mode where all of the nondefective matrix columns are tested simultaneously, but only the redundant columns that are mapped to replace defective matrix columns are tested along with the nondefective matrix columns, CRS is inactive logic 0. Thus, the operation of the circuit $RSC_0$ is the same as discussed above during normal operation of the memory 10. That is, if the redundant column 0 is mapped to replace a defective matrix column, the circuit $RSC_0$ selects it during the second test mode, and if the redundant column 0 is not so mapped, $RSC_0$ does not select it.

In both the first and second test modes, the memory cells in the selected matrix and redundant columns are often stressed with an elevated DC voltage, for example 7–9 V. This elevated voltage is typically applied to one of the bit-true and bit-complement lines of a column, while 0 V is applied to the other line. Then the voltages are reversed. If the memory cells do not fail when subjected to this elevated voltage, then one can be pretty sure that they will not fail when subjected to normal operating voltages, for example 5 V.

An advantage provided by the second test mode is that it can be performed after defective matrix columns have been replaced with redundant columns, and only the redundant columns that are mapped will be tested. Thus, because it will not affect the operation of the memory 10, a defective, unmapped redundant column will not cause the second test mode to identify the memory 10 as defective. Therefore, the second test mode prevents the possible discarding of a functional memory 10 because an unmapped redundant column is defective.

FIG. 5 is a schematic diagram of a first embodiment of a section 23 of the matrix column select circuit 22 of FIG. 2. There is one placement of the section 23 for each column within a matrix-column group 40a–40h of FIG. 3. Although only the one placement for the matrix column 0 in group 40a is shown, it is understood that each placement is structured and operates in a similar fashion. The section 23 includes matrix pass gates or switches 82 and 84, which are respectively coupled between the bit-true and bit-complement lines of the matrix column 0 and the read lines $RBT_0$ and $RBC_0$, and which each include a control terminal that is coupled to the active-low column select signal $\overline{COL0}$. In the illustrated embodiment of the invention, the switches 82 and 84 are PMOS transistors. The section 23 also includes matrix pass gates or switches 86 and 88, which are respectively coupled between the bit-true and bit-complement lines of the matrix column 0 and the write lines $WBT_0$ and $WBC_0$, and which each include a control terminal that is coupled to $\overline{COL0}$ via an inverter 90. In the illustrated embodiment, the switches 86 and 88 are NMOS transistors. Selectively conductive isolation elements 92 and 94, when nonconductive, respectively isolate the bit-true line from the switches 82 and 86 and the bit-complement line from the switches 84 and 88.

In operation during a read or write cycle when the matrix column 0 is not selected, but is functional, i.e., is not defective and thus has not been replaced with a redundant column, $\overline{COL0}$ is inactive logic 1, which inactivates the switches 82, 84, 86, and 88. The inactive switches 82, 84, 86, and 88 uncouple, i.e., isolate, the bit-true and bit-complement lines of the matrix column 0 from the lines $RBT_0$ and $WBT_0$, and $RBC_0$ and $WBC_0$ respectively, and thus prevent any reading of data from or writing of data to the memory cells in the matrix column 0. When the column 0 is selected, $\overline{COL0}$ is active logic 0, which activates the switches 82, 84, 86, and 88. The active switches 82, 84, 86, and 88 couple the bit-true and bit-complement lines of the matrix column 0 to the lines $RBT_0$ and $WBT_0$, and $RBC_0$ and $WBC_0$, respectively, and thus allow the reading of data from or writing of data to the memory cells in the matrix column 0.

If the matrix column 0 is found to be defective during testing of the memory 10, a redundant memory column is mapped to the address of the defective matrix column 0, and the isolation elements 92 and 94 are made nonconductive to isolate the bit-true and bit-complements lines of the defective matrix column 0 from the lines $RBT_0$ and $WBT_0$, and $RBC_0$ and $WBC_0$, respectively. Thus, even when $\overline{COL0}$ is active logic 0 and the switches 82, 84, 86, and 88 are active, the defective matrix column 0 is isolated from the read and write lines and does not adversely affect the operation of the memory 10.

Figure 6:
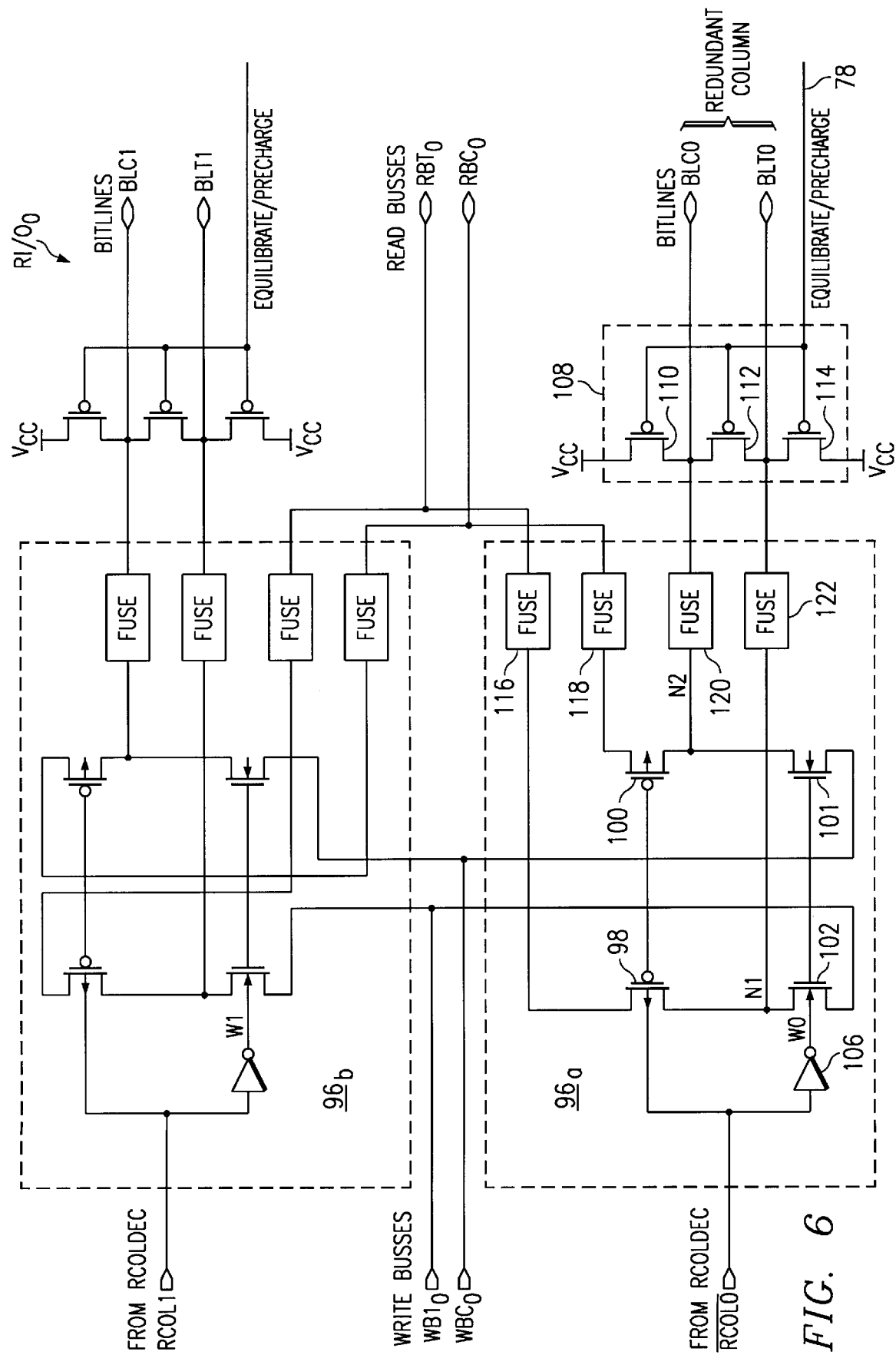
FIG. 6 is a schematic diagram of a first embodiment of a redundant-column select circuit of the redundant-column decode and select circuit of FIG. 2.

FIG. 6 is a schematic diagram of two redundant-column select circuits 96a and 96b of the $RI/O_0$ circuit of FIG. 3 according to a first embodiment of the invention, it being understood that the redundant-column select circuits of $RI/O_1$–$RI/O_7$ are structured and operate in a similar manner. When selected, the circuit 96a couples the redundant column 0 from the redundant-column group 42 (FIG. 3) to the read and write lines $RBT_0$, $WBT_0$, $RBC_0$, and $WBC_0$, and the circuit 96b couples the redundant column 1 from the redundant-column group 42 to the same read and write lines. For clarity, only the circuit 96a is described in detail, it being understood that the circuit 96b is structured and operates in a similar manner.

The redundant-column select circuit 96a includes a first pair of redundant pass gates or switches 98 and 100, which are respectively coupled between the bit-true and bit-complement lines of the redundant column 0 and $RBT_0$ and $RBC_0$, and which each have a control terminal coupled to $\overline{RCOL0}$. A second pair of redundant switches 102 and 104 are respectively coupled between the bit-true and bit-complement lines of the redundant column 0 and $WBT_0$ and $WBC_0$, and each have a control terminal coupled to $\overline{RCOL0}$ via an inverter 106. In the illustrated embodiment of the invention, the switches 98 and 100 are PMOS transistors, and the switches 102 and 104 are NMOS transistors. Selectively conductive elements 116 and 118 are respectively coupled between $RBT_0$ and $RBC_0$ and the switches 98 and 100, and selectively conductive elements 120 and 122 are respectively coupled between the bit-true line of the redundant column 0 and the switches 100 and 104 and the bit-complement line and the switches 98 and 102.

An equilibrate and precharge circuit 108 includes PMOS transistors 110, 112, and 114, which precharge and equilibrate the bit-true and bit-complement lines of the redundant column 0 in a conventional manner. During operation between each read and write cycle, the equilibrate and precharge circuit 108 receives an active-low equilibrate/precharge signal, and, in response thereto, couples the bit-true and bit-complement lines of the redundant column 0 to both Vcc and one another such that these complementary bit lines carry the same voltage level at the beginning of each read and write cycle.

In operation when the redundant column 0 has not been mapped to the address of a defective matrix column, as described above in conjunction with FIG. 4b, $\overline{RCOL0}$ is inactive logic 1, which inactivates the switches 98, 100, 102, and 104. These inactive switches uncouple the redundant column 0 from the read and write lines $RBT_0$, $RBC_0$, $WBT_0$, and $WBC_0$.

If the redundant column 0 is mapped to replace a matrix column that is coupled to read and write lines other than $RBT_0$, $RBC_0$, $WBT_0$, and $WBC_0$, the elements 116, 118, 120 and 122 are made nonconductive such that the redundant column 0 is isolated from $RBT_0$, $RBC_0$, $WBT_0$, and $WBC_0$ regardless of the logic level of $\overline{RCOL0}$.

If the redundant column 0 is mapped to replace the matrix column 0 of the matrix-column group 40a (FIG. 3), the elements 116, 118, 120 and 122 are made conductive, and the corresponding elements in the other redundant-column select circuits of $RI/O_1$–$RI/O_7$ are made nonconductive such that the redundant column 0 is isolated from $RBT_1$–$RBT_7$, $RBC_1$–$RBC_7$, $WBT_1$–$WBT_7$, and $WBC_1$–$WBC_7$. As discussed above in conjunction with FIG. 4b, in operation when the defective matrix column 0 is addressed, $\overline{RCOL0}$ is active logic 0, which activates the switches 98, 100, 102, 104. These active switches couple the bit-true line of the redundant column 0 to $RBT_0$ and $WBT_0$, and couple the bit-complement line to $RBC_0$ and $WBC_0$ such that data is read from and written to the redundant column 0 instead of the defective matrix column 0.

Figure 7:
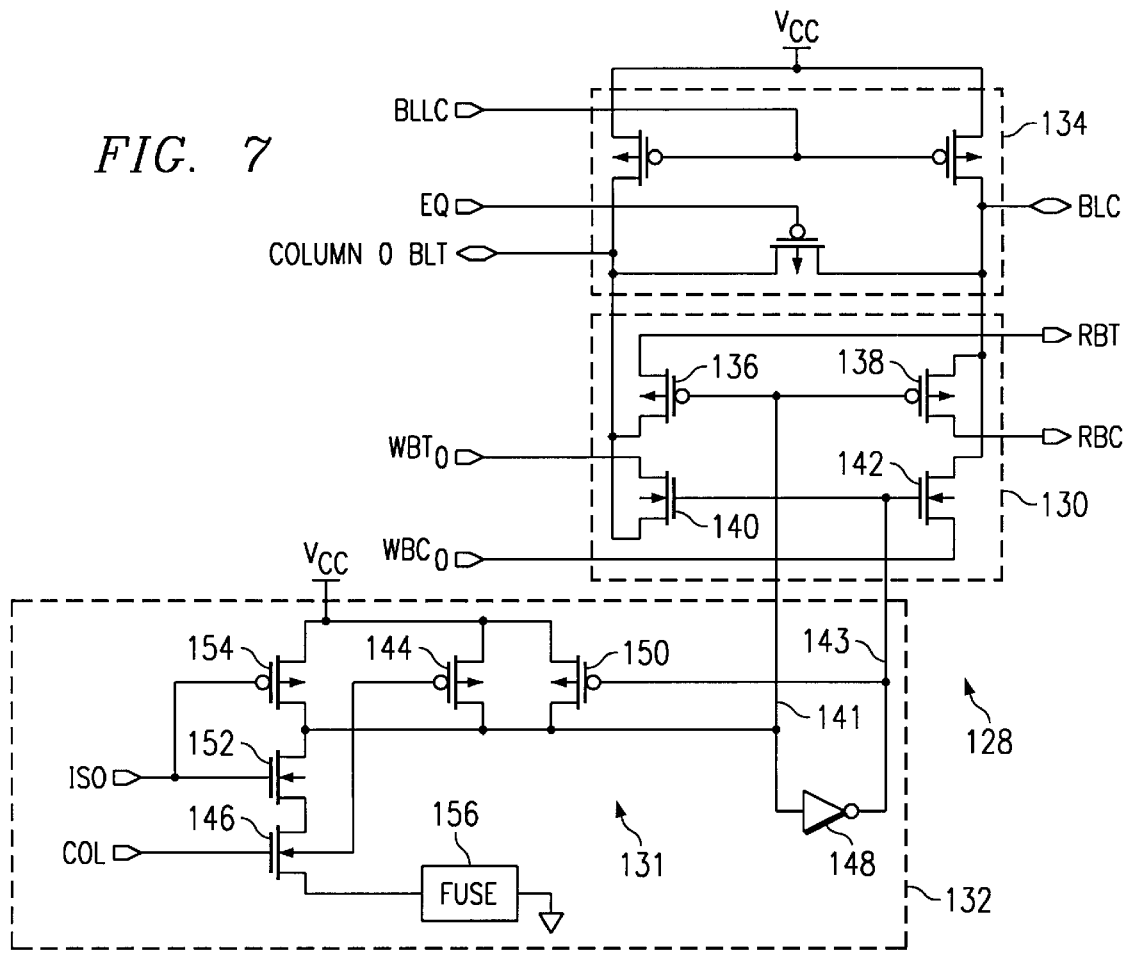
FIG. 7 is a schematic diagram of a second embodiment of a memory-column select circuit of the matrix-column select circuit of FIG. 2.

FIG. 7 is a schematic diagram of a second embodiment of a section of the matrix-column select circuit 22 of FIG. 2. There is one placement of the section 128 for each column within a matrix-column group 40a–40h (FIG. 3). Although only the placement of the section 128 for the matrix column 0 in group 40a is shown, it is understood that each placement of the section 128 is structured and operates in a similar fashion.

The section 128 includes a conventional precharge and equilibrate circuit 134, which precharges and equilibrates the bit-true and bit-complement lines of the matrix column 0 between read and write cycles. The section 128 also includes a matrix switch circuit 130, which includes matrix switches 136 and 138. The switches 136 and 138 are respectively coupled between the bit-true and bit-complement lines of the matrix column 0 and the read lines $RBT_0$ and $RBC_0$. Each of the switches 136 and 138 include a control terminal that is coupled to a first output 141 of a matrix-switch control circuit 132. The matrix switch circuit 130 also includes matrix switches 140 and 142, which are respectively coupled between the bit-true and bit-complement lines of the matrix column 0 and the write lines $WBT_0$ and $WBC_0$. Each of the switches 140 and 142 include a control terminal that is coupled to a second output 143 of the matrix-switch control circuit 132. In the illustrated embodiment of the invention, the switches 136 and 138 are PMOS transistors, and the switches 140 and 142 are NMOS transistors.

The matrix-switch control circuit 132 includes a first inverter that is formed from a PMOS transistor 144 and an NMOS transistor 146. The first inverter receives active-high COL0 at its input, and provides the first output 141 of the circuit 132. A second inverter 148 inverts the signal at the first output 141 and provides the second output 143 of the circuit 132. The inverter 148 and a PMOS transistor 150 are coupled to form a latch circuit 151. The control circuit 132 also receives the block-enable signal ISO, which as described above in conjunction with FIG. 4b, is active logic 1 when the block $B_0$ (FIG. 1) is selected. ISO is coupled to the gates of an optional enable NMOS transistor 152 and an optional reset PMOS transistor 154. A selectively conductive disable element 156 is coupled between the transistor 146 and the supply voltage Vss.

In operation between read and write cycles, the precharge and equilibrate circuit 134 operates in a manner similar to that of the precharge and equilibrate circuit 108 of FIG. 6 to precharge and equilibrate the bit-true and bit-complement lines of the matrix column 0.

During a read or write cycle involving the matrix column 0 when it is not defective, ISO is active logic 1, which activates the transistor 152 and deactivates the transistor 154. $\overline{COL0}$ is active logic 1, which activates the transistor 146 and deactivates the transistor 144. The active transistor 146 drives the gates of the transistors 136 and 138 to logic 0, which activates these transistors. The active transistors 136 and 138 respectively couple $RBT_0$ and $RBC_0$ to the bit-true and bit-complement lines of the matrix column 0. Likewise, the inverter 148 inverts the logic 0 at the gates of the transistors 136 and 138 to logic 1, which activates the transistors 140 and 142. The active transistors 140 and 142 respectively couple $WBT_0$ and $WBC_0$ to the bit-true and bit-complement lines of the matrix column 0.

During a read or write cycle involving a matrix column other than the matrix column 0 of the block $B_0$, either or both ISO or COL0 is inactive logic 0. When ISO is logic 0 to indicate that the block $B_0$ is not selected, the transistor 152 is inactive and the transistor 154 is active. The active transistor 154 couples Vcc, which is equivalent to logic 1, to the gates of the transistors 136 and 138, and thus deactivates hem. The inverter 148 provides logic 0 to the gates of transistors 140 and 142, and thus deactivates them. Likewise, when COL0 is logic 0 to indicate that the matrix column 0 of any block $B_0$–$B_{31}$ is not selected, the transistor 146 is inactive and the transistor 144 is active. The active transistor 144 couples Vcc to the gates of the transistors 136 and 138 and thus deactivates them. The inverter 148 provides logic 0 to the gates of transistors 140 and 142 and thus deactivates them. Thus, when either the block $B_0$ or the matrix column 0 is not selected, the section 128 isolates the matrix column 0 of the block $B_0$ from $RBT_0$, $RBC_0$, $WBT_0$, and $WBC_0$.

During a read or write cycle involving the matrix column 0 when it is defective, the element 156 is made nonconductive such that it does not couple the source of the transistor 146 to Vss. During an initialization routine when the memory 10 is powered up, ISO goes inactive logic 0 for a predetermined time and activates the transistor 154, which provides a logic 1 to the input of the inverter 148. The logic 0 at the output of the inverter 148 activates the transistor 150, which reinforces the logic 1 at the input of the inverter 148. The latch circuit 151 thus latches the logic 1 at the gates of the transistors 136 and 138 and the logic 0 at the gates of the transistors 140 and 142, and thus disables these transistors. Therefore, by making the element 156 nonconductive when the matrix column 0 is defective, the control circuit 132 disables the circuit 130 such that it isolates the defective matrix column 0 from the read and write lines.

An advantage of the circuits 132 and 130 is that selectably conductive elements such as fuses are not required between the bit-true and bit-complement lines of matrix column 0 and the circuit 130. Thus, the total number of such elements is reduced by approximately half. Furthermore, the cutting of elements such as laser fuses that are in adjacent bit lines is not required. This reduces the chance of error during the laser cutting of the elements, and is particularly advantageous as the size of memory devices in general decreases, and, therefore, as the pitch between the bit-true and bit-complement lines of each column decreases. Additionally, the series resistances of the bit lines are reduced when such fuses are omitted. This can significantly increase the speed at which the memory cells are accessed. Moreover, the use of such bit-line fuses may put limitations on the manufacturing process, because the sheet resistance of the layer in which the fuses are made must be relatively low. Conversely, the circuits 130 and 132 impose no such limitation.

Figure 8:
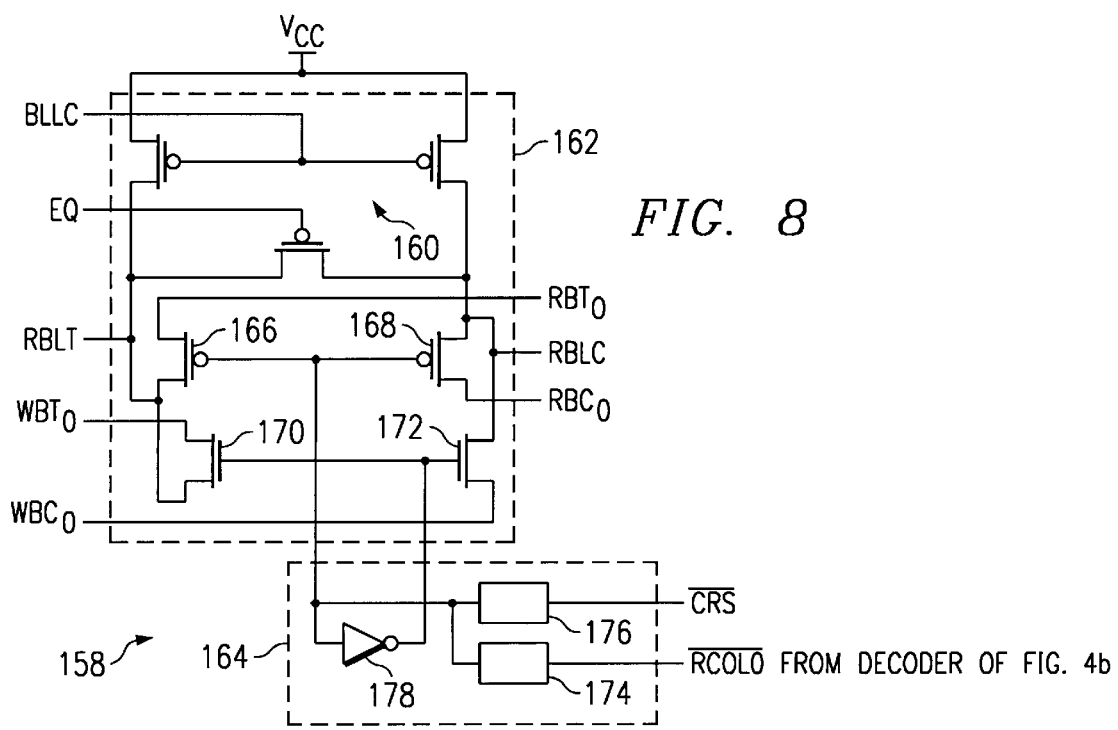
FIG. 8 is a schematic diagram of a second embodiment of a redundant-column select circuit of the redundant-column decode and select circuit of FIG. 2.

FIG. 8 is a schematic diagram of a second embodiment of a redundant select circuit of the redundant-column decode and select circuit 30 of FIG. 2. Although for clarity only the placement of the redundant select circuit 158 of $RI/O_0$ (FIG. 3) that corresponds to the redundant column 0 of the redundant-column group 42 is described, it is understood that the remaining redundant select circuits 158 of $RI/O_0$–$RI/O_7$ have a similar structure and operate in a similar manner. Furthermore, the combination of the section 128 (FIG. 7) of the matrix-column select circuit 22 (FIG. 2) and the redundant select circuit 158 may be referred to as a memory access circuit. The redundant select circuit 158 includes a precharge and equilibrate circuit 160, which is similar in structure and operation to the precharge and equilibrate circuit 134 of FIG. 7. A redundant switch circuit 162 selectively couples $RBT_0$, $RBC_0$, $WBT_0$, and $WBC_0$ to the bit-true and bit-complement lines of the redundant column 0 of the block $B_0$ (FIG. 3). A redundant-switch control circuit 164 controls the switch circuit 162.

More specifically, the redundant switch circuit 162 includes switches 166 and 168, which are respectively coupled between the bit-true and bit-complement lines of the redundant column 0 and $RBT_0$ and $RBC_0$, and includes switches 170 and 172, which are respectively coupled between the bit-true and bit-complement lines and $WBT_0$ and $WBC_0$. In the illustrated embodiment, the switches 166 and 168 are PMOS transistors, and the switches 170 and 172 are NMOS transistors. The redundant-switch control circuit 164 includes a first selectively conductive element 174, which is coupled between $\overline{RCOL0}$ (from the decoder $RSC_0$ of FIG. 4b) and the control terminals of the switches 166 and 168, and a second selectively conductive element 176, which is coupled between the active-low signal $\overline{CRS}$ and the control terminals of the switches 166 and 168. An inverter 178 is coupled between the elements 174 and 176 and the control terminals of the switches 170 and 172.

In operation during a read or write cycle when the redundant column 0 has not been mapped to replace any defective matrix columns, both elements 174 and 176 are made conductive. Furthermore, both $\overline{RCOL0}$ and $\overline{CRS}$ are inactive logic 1 to disable the switch circuit 162, which thus isolates the redundant column 0 from $RBT_0$, $RBC_0$, $WBT_0$, and $WBC_0$. The elements 174 and 176 in the circuits 158 of $RI/O_0$–$RI/O_7$ are also made conductive, such that the unmapped redundant column 0 is also isolated from $RBT_1$–$RBT_7$, $RBC_1$–$RBC_7$, $WBT_1$–$WBT_7$, and $WBC_1$–$WBC_7$.

During a read or write cycle when the redundant column 0 has been mapped to replace a defective matrix column in one of the matrix-column groups 40b–40h of the block B0, such that the redundant column 0 is to be coupled to a corresponding foursome of $RBT_1$–$RBT_7$, $RBC_1$–$RBC_7$, $WBT_1$–$WBT_7$, and $WBC_1$–$WBC_7$, the element 174 is made nonconductive and the element 176 is made conductive. Thus, whenever $\overline{RCOL0}$ goes active logic 0, $\overline{CRS}$ remains inactive logic 1 to disable the circuit 162 such that the redundant column 0 is isolated from $RBT_0$, $RBC_0$, $WBT_0$, and $WBC_0$.

During a read or write cycle when the redundant column 0 is mapped to replace the matrix column 0 of the matrix-column group 40a, the element 174 is made conductive, and the element 176 is made nonconductive. Thus, when the defective matrix column 0 is addressed, the decoder circuit $RSC_0$ of FIG. 4b drives $\overline{RCOL0}$ active logic 0, which activates the switches 166, 168, 170, and 172. These active switches couple the bit-true line of the redundant column 0 to $RBT_0$ and $WBT_0$, and couple the bit-complement line of the redundant column 0 to $RBC_0$ and $WBC_0$. In the circuits 158 of $RI/O_1$–$RI/O_7$, the elements 174 are made nonconductive and the elements 176 are made conductive such that the redundant column 0 is isolated from $RBT_1$–$RBT_7$, $RBC_1$–$RBC_7$, $WBT_1$–$WBT_7$, and $WBC_1$–$WBC_7$.

As discussed above in conjunction with FIG. 4b, during the first test mode that simultaneously tests all the matrix columns and all of the redundant columns before any redundant columns have been mapped to replace defective matrix columns, the elements 174 and 176 are conductive in all of the redundant select circuits 158 of $RI/O_0$–$RI/O_7$. Furthermore, $\overline{RCOL0}$ is active logic 0 such that the redundant column 0 is coupled to all of the lines $RBT_0$–$RBT_7$, $RBC_0$–$RBC_7$, $WBT_0$–$WBT_7$, and $WBC_0$–$WBC_7$. In order that there is no signal conflict at the input of the inverter 178, $\overline{CRS}$ is also active logic 0. Thus, an advantage of the control circuit 164 is that by ensuring that there is no conflict between $\overline{RCOL0}$ and $\overline{CRS}$ when the both of the elements 174 and 176 are conductive, the switching transistors of conventional control circuits may be omitted. Furthermore, the circuit 164 also allows one to omit the selectively conductive elements 116, 118, 120, and 122 of FIG. 6, and thus reduce the number of such elements by approximately half. Such elimination of switching transistors and elements reduces the layout area of the memory 10. Furthermore, where the elements are laser fuses, the reduction in the number of fuses allows an increase in the spacing between the fuses, and thus reduces the chance of error when the fuses are cut. Additionally, the elimination of such conductive elements decreases the resistances of the bit-line paths, and thus decreases the access times of the memory cells.

During the second test mode that occurs after selected redundant memory columns have been mapped to the addresses of defective matrix columns, $\overline{CRS}$ is inactive logic 1 so that only the mapped redundant columns are accessed simultaneously with the matrix columns. Thus, if the redundant column 0 is mapped to replace a defective matrix column, $\overline{RCOL0}$ goes active logic 0 to select the redundant column 0 as discussed above in the description of the operation of the redundant-column select circuit 158. Likewise, if the redundant column 0 is not so mapped, $\overline{RCOL0}$ remains inactive logic 1 such that the redundant column 0 is not selected.

Figure 9:
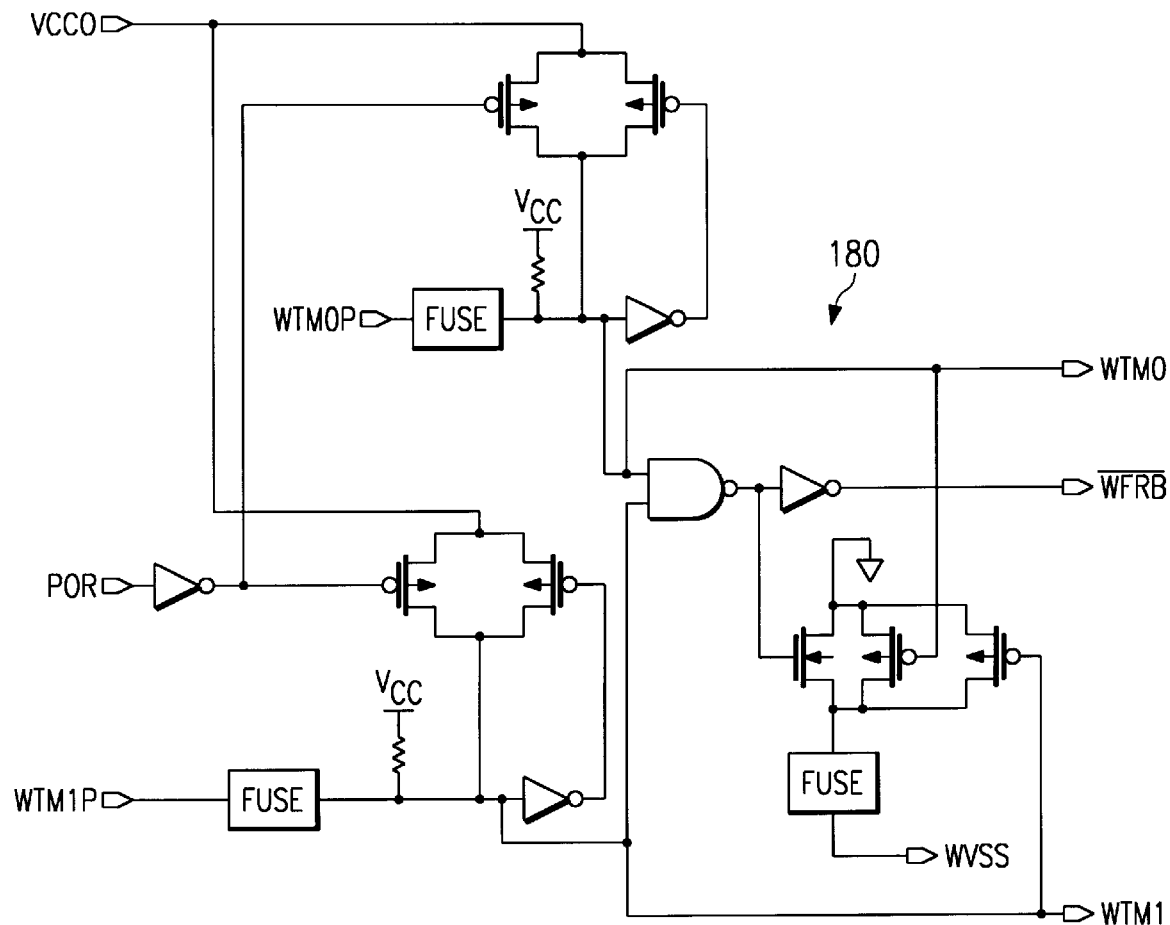
FIG. 9 is a schematic diagram of one embodiment of a portion of the wafer test-mode circuitry of FIG. 2.

FIG. 9 is a schematic diagram of a wafer test-mode power circuit 180 of the wafer test-mode circuit 38 of FIG. 2. The circuit 180 allows the memory 10 to be tested before the die on which the memory 10 is formed is scribed from the wafer (not shown). When either of the signals WTM0 or WTM1 is a logic 0, the circuit 180 generates an active logic 0 for a signal $\overline{WFRB}$. The circuit 180 is further described in U.S. patent application Ser. No. 08/710,357, entitled INTEGRATED CIRCUIT THAT SUPPORTS AND METHOD FOR WAFER-LEVEL TESTING, filed Sep. 17, 1996 (Seed and Berry docket number 850063.456/457) and U.S. patent application Ser. No. 08/710,356, entitled "INTEGRATED-CIRCUIT DIE SUITABLE FOR WAFER-LEVEL TESTING AND METHOD FOR FORMING THE SAME, filed Sep. 17, 1996 (Seed and Berry docket number 850063.458), which are incorporated by reference herein.

Figure 10:
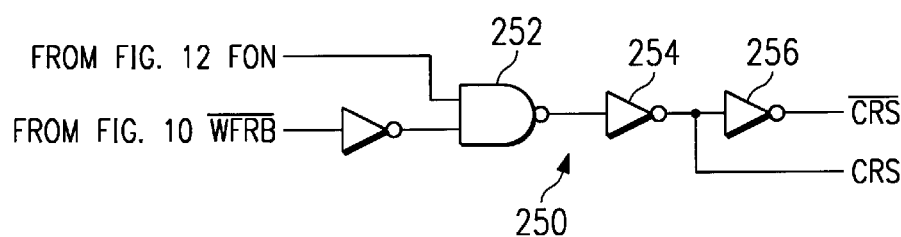
FIG. 10 is a schematic diagram of one embodiment of a first portion of the control circuit of FIG. 2.

FIG. 10 is a schematic diagram of a logic circuit 250 of the control circuit 36 of FIG. 2. The circuit 250 generates the signals CRS and $\overline{CRS}$ of FIGS. 4b and 8. In operation, during the first test mode when $\overline{WFRB}$ (FIG. 9) is active logic 0 and a signal FON (FIG. 11) is active logic 1, a NAND gate 252 generates logic 0 at its output. A first inverter 254 generates an active logic 1 for CRS, and a second inverter 256 generates an active logic 0 for $\overline{CRS}$. During the second test mode when $\overline{WFRB}$ is inactive logic 1 and FON is inactive logic 0, the circuit 250 generates an inactive logic 0 for CRS and an inactive logic 1 for $\overline{CRS}$.

Figure 11:
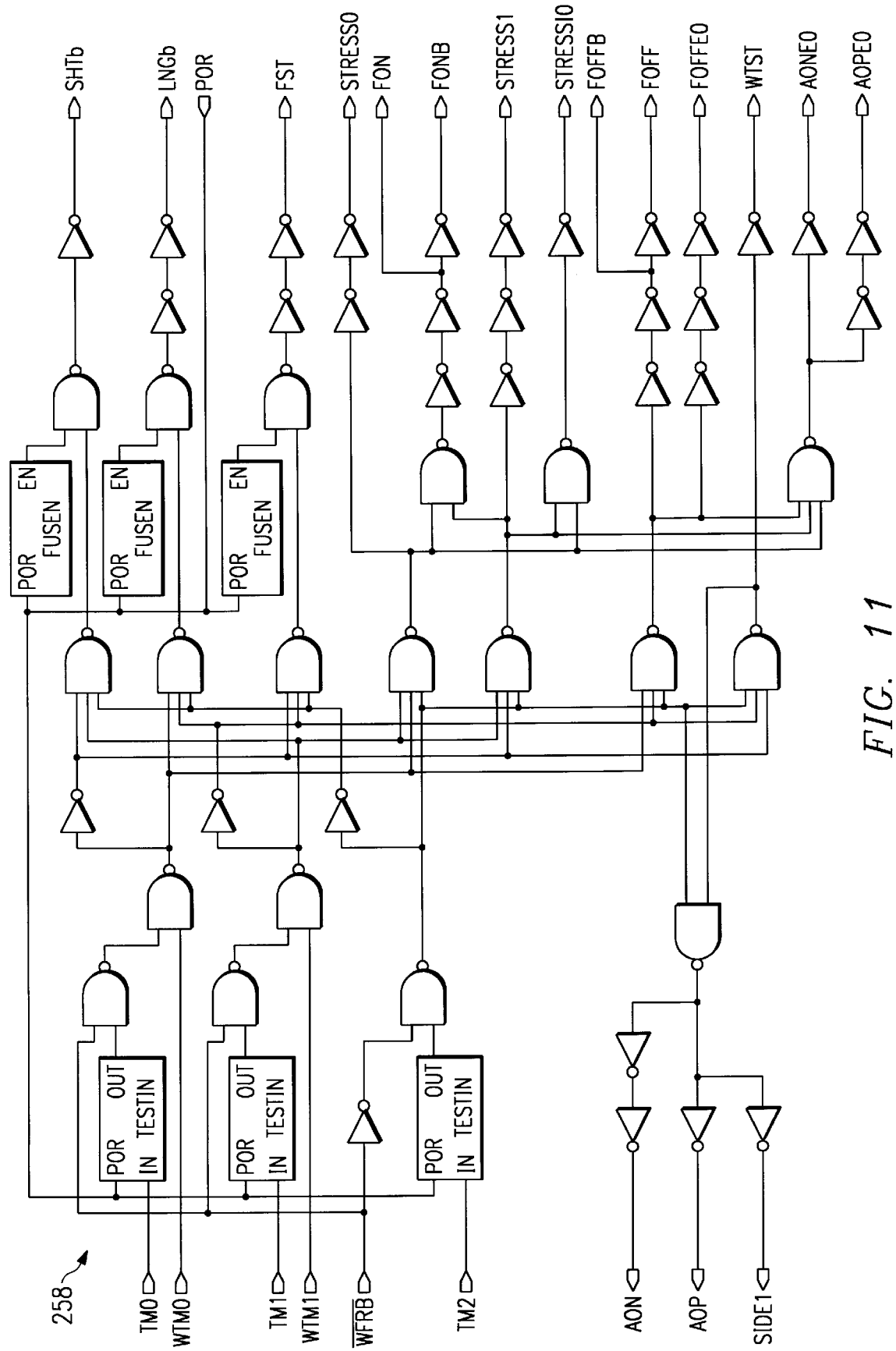
FIG. 11 is a schematic diagram of one embodiment of a test-mode logic circuit that forms a second portion of the control circuit of FIG. 2.

FIG. 11 is a schematic diagram of test-mode logic circuit 258 of the control circuit 36 of FIG. 2. The circuit 258 generates FON (FIG. 10) and other signals from test-mode signals TM0–TM2, wafer test-mode signals WTM0–WTM1, and $\overline{WFRB}$. The circuit 258 is further described in U.S. patent application Ser. No. 08/587,708, entitled DEVICE AND METHOD FOR DRIVING A CONDUCTIVE PATH WITH A SIGNAL, filed Jan. 19, 1996; U.S. patent application Ser. No. 08/588,762, entitled DATA-INPUT DEVICE FOR GENERATING TEST SIGNALS ON BIT AND BIT-COMPLEMENT LINES, filed Jan. 19, 1996; U.S. patent application Ser. No. 08/589,141, entitled WRITE DRIVER HAVING A TEST FUNCTION, filed Jan. 19, 1996; U.S. patent application Ser. No. 08/589,140, entitled MEMORY-ROW SELECTOR HAVING A TEST FUNCTION, filed Jan. 19, 1996; U.S. patent application Ser. No. 08/588,740, entitled DEVICE AND METHOD FOR ISOLATING BIT LINES FROM A DATA LINE, filed Jan. 19, 1996; and U.S. patent application Ser. No. 08/589,024, entitled LOW-POWER READ CIRCUIT AND METHOD FOR CONTROLLING A SENSE AMPLIFIER, filed Jan. 19, 1996, which are incorporated by reference herein.

FIG. 12 is a schematic diagram of one embodiment of a redundant-row decoder 260 of the redundant-row decode and select circuit 28 of FIG. 2. In one embodiment, the memory 10 includes four redundant rows and the circuit 28 includes two circuits 260, one for each pair of the four redundant rows. The redundant-row decoder 260 includes a decoder 262a, which is associated with the redundant row 0, and a decoder 262b, which is associated with the redundant row 1. The remaining redundant-row decoder 260 is associated with the redundant rows 3 and 4. For clarity, the decoder 262a is described in detail, it being understood that the decoder 262b is structured and operates in a similar manner.

The decoder 262a includes an enable circuit 264a and a select circuit 266a. When the redundant row 0 is mapped to the address of a defective matrix row, the enable circuit 264a enables the select circuit 266a to activate the redundant row 0 when the defective matrix row is addressed.

The enable circuit 264a includes a selectively conductive element 268a, which is made conductive when the redundant row 0 is not mapped to replace a defective matrix row, and which is made nonconductive when the redundant row 0 is so mapped. The circuit 264a also includes an NMOS transistor 270a, a latch 272a, which includes an NMOS transistor 274a and an inverter 276a, and an inverter 278a.

The select circuit 266a includes 8 pass gates or switches 280a (only one is shown for clarity), which receive row-address true signals $Rat_1$–$Rat_8$, and 8 switches 282a (only one is shown for clarity), which receive row-address complement signals $Rac_1$–$Rac_8$. Eight selectively conductive elements 284a (only one is shown for clarity) are each serially coupled between a corresponding one of the switches 280a and a corresponding one of the nodes $NFA_1$–$NFA_8$. Eight selectively conductive elements 286a (only one is shown for clarity) are serially coupled between a corresponding one of the switches 282a and a corresponding one of the nodes $NFA_1$–$NFA_8$. Eight switches 287a (only one is shown for clarity) each have a control terminal coupled to the output of the inverter 278a, and are coupled between a corresponding one of the nodes $NFA_1$–$NFA_8$ and Vss. The nodes $NFA_1$–$NFA_3$ are coupled to the respective inputs of a NAND gate 288a, nodes $NFA_4$–$NFA_6$ are coupled to the respective inputs of a NAND gate 290a, and the nodes $NFA_7$–$NFA_8$ are coupled to the respective inputs of a NAND gate 292a. The outputs of the NAND gates 288a, 290a, and 292a are coupled to the respective inputs of a NOR gate 294a, which has an output coupled to an input of a NOR gate 296a. The NOR gate 296a generates the active-low, redundant-row-0 select signal $\overline{RRWDC\text{-}0}$. A second input of the NOR gate 296a is coupled to receive CRS (FIG. 10).

In operation during a read or write cycle when the redundant row 0 is not mapped to replace a defective matrix row, the element 268a is conductive and CRS is inactive logic 0. The inverters 276a and 278a generate logic 0 and logic 1 respectively to inactivate the switches 280a, and to activate the switches 287a. These active switches drive the inputs of the NAND gates 288a, 290a, and 292a to logic 0. The NAND gates 288a, 290a, and 292a generate logic 0s at their outputs, thus causing the NOR gate 294a to output logic 0. Because both CRS and the output of the NOR gate 294a are logic 0, $\overline{RRWDC\text{-}0}$ is inactive logic 1. Thus, the circuit 262a does not select the redundant row 0.

In operation during a read or write cycle when the redundant row 0 is mapped to replace a defective matrix row, the element 268a is nonconductive and CRS is inactive logic 0. The inverters 276a and 278a generate logic 1 and logic 0 respectively to activate the switches 280a, and to inactivate the switches 287a. The appropriate ones of the elements 284a and 286a are made nonconductive such that when the values of $Rat_1$–$Rat_8$ and $Rac_1$–$Rac_8$ correspond to the defective matrix row, the NAND gates 288a, 290a, and 292a receive logic 1 at each of their inputs. For example, if the defective matrix row corresponds to $Rat_1$–$Rat_8$ all equal logic 1 and $Rac_1$–$Rac_8$ all equal logic 0, then all eight elements 284a are made conductive, and all eight elements 286a are made nonconductive. Thus, when the defective row is addressed, the NAND gates 288a, 290a, and 292a receive logic 1 at all of their inputs and generate logic 0s at their outputs, and $\overline{RRWDC\text{-}0}$ is active logic 0 to select the redundant row 0.

During the first test mode as discussed above in conjunction with FIGS. 4b, 7, and 8, where all the matrix rows and redundant rows, whether mapped or not, are simultaneously accessed, CRS is active logic 1, which forces the output of the NOR gate 296a to logic 0. Thus, $\overline{RRWDC\text{-}0}$ is active logic 0 regardless of whether the redundant row 0 is mapped or not.

During the second test mode where all matrix rows and mapped redundant rows, but not unmapped redundant rows, are simultaneously selected, CRS is inactive logic 0, and the signals $Rat_1$–$Rat_8$ and $Rac_1$–$Rac_8$ are all logic 1. Because $Rat_1$–$Rat_8$ and $Rac_1$–$Rac_8$ are all logic 1, if the redundant row 0 is mapped to any defective matrix row, the circuit 262a operates as discussed above to select the redundant row 0.

FIG. 13 is a schematic diagram of a multiplexer circuit 300, which is similar to the redundant-switch control circuit 164 (FIG. 8), and which may be used for other applications in the memory 10 or in other circuits where a multiplexer is needed. The multiplexer 300 includes k input terminals, which receive input signals $IN_0$–$IN_{k-1}$, k selectively conductive elements $F_0$–$F_{k-1}$, which are each coupled between a corresponding input terminal and a node 302, a selectively conductive pull-down element $F_P$, which is coupled between the node 302 and a reference voltage such as Vss, and an inverter 304, which is coupled between the node 302 and an output terminal 305.

During operation when none of a plurality of parallel-connected multiplexers 300 are used, the elements $F_0$–$F_{k-1}$ and $F_P$ of every multiplexer 300 are made conductive, and $IN_0$–$IN_{k-1}$ are each at the same logic level, here logic 0, such that there is no signal conflict at the node 302. That is, each input signal $IN_0$–$IN_{k-1}$ and Vss drive the node 302 to the same logic level, not to different logic levels. In another embodiment of the invention, the element $F_P$ is coupled to Vcc, and each signal $IN_0$–$IN_{k-1}$ is logic 1. Alternatively, one may make all of the elements $F_0$–$F_{k-1}$ nonconductive and the element $F_P$ conductive, or may make the elements $F_0$–$F_{k-1}$ conductive, the element $F_P$ nonconductive, and $IN_0$–$IN_{k-1}$ equal to the same logic level.

During operation when at least one of the parallel-connected multiplexers 300 is used to couple a selected one of the input signals $IN_0$–$IN_{k-1}$ to the output 305, all the elements $F_0$–$F_{k-1}$ of the used multiplexer 300 are made nonconductive except the element that is coupled to the selected input signal. $F_P$ of the used multiplexer 300 is also made nonconductive. For example, if one desires a used multiplexer 300 to couple $IN_0$ to the output 305, then all the elements $F_1$–$F_{k-1}$ and $F_P$ are made nonconductive, and $F_0$ is made conductive. Thus only the selected signal $IN_0$ propagates through to the output 305. With respect to each of the unused ones of the parallel-connected multiplexers 300, all the elements $F_0$–$F_{k-1}$ are made nonconductive, and the element $F_P$ is made conductive.

An advantage of the multiplexer 300 is that it has fewer components than similar conventional multiplexers. For example, the multiplexer 300 does not require components such as transistors to isolate the input signals from the node 302. Such a reduction in components often reduces the overall layout area of the memory device 10, and increases the speed of the multiplexer 300 because there are no transistor or gate delays.

FIG. 14 is a block diagram of a computer system 306, which incorporates the memory 10 of FIGS. 1 and 2. The computer system 306 includes computer circuitry 308 for performing computer functions, such as executing software to perform desired calculations and tasks. The circuitry 308 typically includes a processor 310 and the memory 10, which is coupled to the processor 310. One or more input devices 312, such as a keypad or a mouse, are coupled to the computer circuitry 308 and allow an operator (not shown) to manually input data thereto. One or more output devices 314 provide to the operator data that is generated by the computer circuitry 308. Examples of such output devices 314 include a printer and a video display unit, such as a cathode-ray tube (CRT) display. One or more data-storage devices 316 are coupled to the computer circuitry 308 to store data on or retrieve data from external storage media (not shown). Examples of the storage devices 316 and the corresponding storage media include drives that accept hard and floppy disks, tape cassettes, and compact disk read-only memories (CD-ROMs). Typically, the computer circuitry 308 includes address, data, and control busses that are respectively coupled to the address, data, and control busses of the memory 10.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A memory device, comprising:
   an array of matrix memory cells each corresponding to a matrix location within said matrix array;
   an array of redundant memory cells each corresponding to a redundant location within said redundant array; and
   address and test circuitry coupled to said matrix and redundant arrays, said circuitry operable during a first test mode to simultaneously address all of said matrix locations and select all of said redundant memory cells, said circuitry operable during a second test mode to simultaneously address all of said matrix locations and select only those of said redundant memory cells that are mapped to matrix locations.

2. The memory device of claim 1 wherein said address and testing circuitry comprises:
   an address decoder operable during said first and second test modes to simultaneously generate matrix-cell address signals corresponding to all of said matrix locations;
   a matrix memory select circuit coupled to said matrix array and to said address decoder, said matrix memory select circuit operable, during said first test mode and in response to said matrix-cell address signals, to simultaneously select all of said matrix memory cells, said matrix memory select circuit operable, during said second test mode and in response to said matrix-cell address signals, to simultaneously select only memory cells corresponding to matrix locations to which a redundant memory cell is not mapped;
   control circuitry operable to generate a redundant control signal having a first value during said first test mode and having a second value during said second test mode; and
   a redundant memory circuit coupled to said control circuitry, said redundant array, and said address decoder, said redundant memory circuit operable, during said first test mode and in response to said first value of said redundant control signal, to simultaneously select all of said redundant memory cells, said redundant memory circuit operable, during said second test mode and in response to said matrix-cell address signals and said second value of said redundant control signal, to simultaneously select only redundant memory cells that are mapped to matrix locations.

3. The memory device of claim 2 wherein said redundant memory circuit comprises:
   a redundant signal generator coupled to said address decoder, said redundant signal generator operable to generate a redundant address signal in response to a matrix-cell address signal when a redundant memory cell is mapped to a corresponding matrix location; and
   a redundant select circuit coupled to said redundant array and said redundant signal generator, said redundant select circuit operable in response to said redundant address signal to select said redundant memory cell that is mapped to said corresponding matrix location.

4. The memory device of claim 2, further comprising:
   a data line;
   said matrix memory cells and said redundant memory cells arranged in matrix and redundant columns respectively, each of said matrix memory cells in a matrix column coupled to a corresponding matrix bit line, each of said redundant memory cells in a redundant column coupled to a corresponding redundant bit line;
   said matrix memory select circuit including for each matrix column,
      a matrix switch coupled between said corresponding matrix bit line and said data line, and
      a matrix-switch control circuit coupled to said matrix switch and operable to close said matrix switch circuit in response to a corresponding matrix-cell address signal from said address decoder; and
   said redundant memory circuit including for each of said redundant columns,
      a redundant signal generator operable to generate a redundant address signal having a first value in response to a matrix-cell address signal when a redundant memory cell is mapped to a corresponding matrix location, and
      a redundant select circuit coupled to said redundant signal generator and including,
         a redundant switch coupled between a corresponding redundant bit line and said data line; and
         a redundant-switch control circuit coupled to said redundant switch and operable to close said redundant switch in response to said first value of said redundant address signal.

5. The memory device of claim 4, further comprising:
   said redundant switch having a control terminal and operable to open when said redundant address signal has a second value;
   said redundant select circuit coupled to receive a redundant disable signal that has said second value, said redundant select circuit including a first programmable element that is coupled between said redundant disable signal and said control terminal and including a second programmable element that is coupled between said redundant address signal and said control terminal, said redundant select circuit operable to open said redundant switch when said redundant disable signal has said second value and said first element is conductive and when said redundant address signal has said second value and said second element is conductive; and
   said redundant signal generator operable to generate said redundant address signal having said second value when both of said first and second selectively conductive elements are conductive.

6. A memory device, comprising:
   first and second power-supply terminals;
   a data line;
   an array of matrix memory cells arranged in matrix columns, each matrix memory cell in a matrix column having an address and coupled to a corresponding matrix bit line;
   an array of redundant memory cells arranged in redundant columns, each redundant memory cell in a redundant column coupled to a corresponding redundant bit line;
   an address decoder operable during first and second test modes to simultaneously generate on output terminals matrix address signals corresponding to all of said addresses of said matrix memory cells;
   control circuitry operable to generate on an output terminal a redundant control signal having a first value during said first test mode and having a second value during said second test mode;
   a matrix select circuit coupled to said address decoder and to said array of matrix memory cells, said matrix select circuit including for each matrix column,
      a matrix switch having a control terminal and coupled between said matrix bit line and said data line, a matrix-switch controller having an input terminal coupled to a corresponding one of said output terminals of said address decoder, an output terminal coupled to said control terminal of said matrix switch, a first power node coupled to said first power-supply terminal, and a second power node, and a first element with selectable conductivity having a first terminal coupled to said second power node of said matrix-switch controller and having a second terminal coupled to said second power-supply terminal; and a redundant memory circuit including for each redundant column, a redundant decoder having an input terminal coupled to a corresponding one of said output terminals of said address decoder and having an output terminal, a redundant switch having a control terminal and coupled between said redundant bit line and said data line, a second element with selectable conductivity having an input terminal coupled to said output terminal of said redundant decoder and having an output terminal coupled to said control terminal of said redundant switch, and a third element with selectable conductivity having an input terminal coupled to said output terminal of said control circuitry and having an output terminal coupled to said control terminal of said redundant switch.

7. The memory device of claim 6 wherein said matrix-switch controller comprises:

a MOS transistor of a first type having a gate coupled to said input terminal of said matrix-switch controller, a source coupled to said first power node, and a drain coupled to said output terminal of said matrix-switch controller; and a MOS transistor of a second type having a gate coupled to said input terminal of said matrix-switch controller, a source coupled to said second power node, and a drain coupled to said output terminal of said matrix-switch controller.

8. The memory device of claim 6 wherein said matrix-column circuit further comprises:

a MOS transistor having a drain coupled to said control terminals of said first and second switches, a source coupled to one of said first and second power-supply terminals, and a gate; and an inverter having an input terminal coupled to said drain of said transistor and having an output terminal coupled to said gate of said transistor.

9. The memory device of claim 6 wherein said matrix select circuit further comprises:

a first MOS transistor having a drain coupled to said control terminal of said matrix switch, a source coupled to one of said first and second power-supply terminals, and a gate;

an inverter having an input terminal coupled to said drain of said transistor and having an output terminal coupled to said gate of said transistor; and a second MOS transistor having a drain coupled to said control terminal of said matrix switch, a source coupled to one of said first and second power-supply terminals, and a gate coupled to receive an initialization signal.

10. The memory device of claim 6 wherein said first, second, and third elements each comprise a fuse element.

11. A computer system, comprising:

a data input device;

a data output device; and computing circuitry that is coupled to said data input and output devices, said computing circuitry including a memory device that includes, an array of matrix memory cells each corresponding to a matrix location within said matrix array, an array of redundant memory cells each corresponding to a redundant location within said redundant array, and address and test circuitry coupled to said matrix and redundant arrays, said circuitry operable during a first test mode to simultaneously address all of said matrix locations and select all of said redundant memory cells, said circuitry operable during a second test mode to simultaneously address all matrix locations such that if a redundant memory cell is mapped to a matrix location, said circuitry selects said redundant memory cell, and such that if a redundant memory cell is not mapped to said matrix location, said circuitry selects the matrix memory cell corresponding to said matrix location.

12. The computer system of claim 11, further comprising:

a data storage device coupled to said computing circuitry; and said computing circuitry including a processor that is coupled to said memory device.

13. The computer system of claim 12 wherein said address and testing circuitry comprises:

an address decoder operable during said first and second test modes to simultaneously generate matrix-cell address signals corresponding to all of said matrix locations;

a matrix memory select circuit coupled to said matrix array and to said address decoder, said matrix memory select circuit operable, during said first test mode and in response to said matrix-cell address signals, to simultaneously select all of said matrix memory cells, said matrix memory select circuit operable, during said second test mode and in response to said matrix-cell address signals, to simultaneously select only memory cells corresponding to matrix locations to which a redundant memory cell is not mapped;

control circuitry operable to generate a redundant control signal having a first value during said first test mode and having a second value during said second test mode; and a redundant memory circuit coupled to said control circuitry, said redundant array, and said address decoder, said redundant memory circuit operable, during said first test mode and in response to said first value of said redundant control signal, to simultaneously select all of said redundant memory cells, said redundant memory circuit operable, during said second test mode and in response to said matrix-cell address signals and said second value of said redundant control signal, to simultaneously select only redundant memory cells that are mapped to matrix locations.

14. A method for testing a memory device, comprising:

simultaneously coupling each matrix memory cell and each redundant memory cell to a data line, each matrix memory cell having a matrix location within said memory device;

after said coupling, identifying defective ones of said matrix memory cells;

mapping an operational redundant memory cell to the matrix location of each of said defective memory cells;

simultaneously addressing each of said matrix locations;

coupling said memory cells which are not defective to said data line during said simultaneous addressing;

coupling a redundant memory cell that is mapped to the matrix location of a defective memory cell to said data line during said simultaneously addressing; and isolating unmapped ones of said redundant memory cells from said data line.

15. The method of claim 14 wherein:

said simultaneously coupling comprises generating a control signal having a first value such that all redundant memory cells are coupled to said data line; and said isolating comprises generating said control signal having a second value such that only redundant memory cells that are mapped to a matrix location are coupled to said data line during said simultaneous addressing.

16. A method for testing a memory circuit, comprising:

during a first test, applying a test voltage via bit lines to all matrix memory cells in said memory circuit;

during said first test, applying said test voltage via said bit lines to all redundant memory cells in said memory circuit while applying said test voltage to said matrix memory cells;

during a second test, applying said test voltage only to matrix memory cells that have not been replaced by redundant memory cells; and while applying said test voltage to said matrix memory cells during said second test, applying said test voltage only to redundant memory cells that replace defective matrix memory cells.

17. The method of claim 16, further comprising simultaneously performing said second test on said memory circuit and other memory circuits that are part of the same wafer as said memory circuit before said memory circuits and said other memory circuits are scribed from said wafer.

18. A method for testing a memory circuit, comprising:

during a first test, applying a test voltage via bit lines to all matrix memory cells in said memory circuit;

during said first test applying said test voltage via said bit lines to all redundant memory cells in said memory circuit while applying said test voltage to said matrix memory cells; and wherein said test voltage includes a substantially constant voltage that is significantly higher than a write voltage applied to said matrix cells during normal operation of said memory circuit.

19. A method for testing a memory circuit, comprising:

during a first test phase, testing all matrix memory cells and redundant memory cells;

replacing each defective matrix memory cell with a redundant memory cell; and during a second test phase, testing only nondefective matrix memory cells and redundant memory cells that replace defective memory cells, said testing performed simultaneously on said nondefective matrix memory cells and said replacement redundant memory cells.

20. The method of claim 19, further comprising testing all matrix memory cells and redundant memory cells simultaneously during said first test phase.

21. The method of claim 19, further comprising performing said first test phase while the die on which the memory circuit is formed is part of a wafer.

22. The method of claim 19, further comprising performing said first and second test phases while the die on which the memory circuit is formed is attached to a wafer.

* * * * *